(12) United States Patent     (10) Patent No.:   US 12,629,930 B2

Ramaswamy et al.     (45) Date of Patent:    May 19, 2026

---

(54) MICRO-TRANSFER PRINTING FROM ADHESIVE SURFACES

(71) Applicant: X-Celeprint Limited, Dublin (IE)

(72) Inventors: Prasanna Ramaswamy, Cork (IE); Ronald S. Cok, Rochester, NY (US); Alin Mihai Fecioru, Cork (IE)

(73) Assignee: X-Celeprint Limited, Dublin (IE)

( * ) Notice: Subject to any disclaimer, the term of this patent is extended or adjusted under 35 U.S.C. 154(b) by 201 days.

(21) Appl. No.: 18/137,627

(22) Filed: Apr. 21, 2023

(65) Prior Publication Data

US 2023/0356520 A1     Nov. 9, 2023

Related U.S. Application Data

(60) Provisional application No. 63/354,484, filed on Jun. 22, 2022, provisional application No. 63/335,163, filed on Apr. 26, 2022.

(51) Int. Cl.
    *B32B 43/00*      (2006.01)
    *H05K 13/04*      (2006.01)
    (Continued)

(52) U.S. Cl.
    CPC ......... *B32B 43/006* (2013.01); *H05K 13/041* (2018.08); *H05K 13/0478* (2013.01);
    (Continued)

(58) Field of Classification Search
    CPC ......... B32B 43/006; B32B 2310/0831; B32B 2457/08; B32B 2457/14; B32B 2457/20;

B65G 47/90; H01L 21/67; H01L 21/67005; H01L 21/67011; H01L 21/67132; H01L 21/67144; H01L 21/68; H01L 21/681; H01L 21/683; H01L 21/6835; H01L 21/6836; H01L 2221/67; H01L 2221/683;

(Continued)

(56) References Cited

U.S. PATENT DOCUMENTS 8,722,458 B2    5/2014   Rogers et al.
9,358,775 B2    6/2016   Bower et al.
    (Continued)

FOREIGN PATENT DOCUMENTS

WO    WO-2020089036 A1 *   5/2020   ....... H01L 21/67144
WO    WO-2022268431 A1 *   12/2022  ............ B23K 26/36

*Primary Examiner* — Michael A Tolin

(74) *Attorney, Agent, or Firm* — Choate, Hall & Stewart LLP; Michael D. Schmitt

(57) ABSTRACT

A method of assembling components includes the steps of providing a stamp, providing a component disposed on an adhesive surface, pressing the stamp against the component to adhere the component to the stamp, pulling the stamp away from the adhesive surface, and removing the component from the adhesive surface with the stamp. The adhesive surface can deform in a direction of the stamp and can enable progressive delamination of the adhesive surface from a bottom of the component from an edge or corner of the component toward a center of the component, thereby reducing the instantaneous adhesive force between the component and at least a portion of the adhesive surface. The method can enable the transfer and assembly of many millions of small and fragile components per hour with excellent precision from a tape to a target substrate.

25 Claims, 33 Drawing Sheets

(51) Int. Cl.
_H10P 72/70_ (2026.01)
_H10P 72/00_ (2026.01)

(52) U.S. Cl.
CPC ...... _H10P 72/7412_ (2026.01); _H10P 72/7414_ (2026.01); _B32B 2310/0831_ (2013.01); _B32B 2457/08_ (2013.01); _H10P 72/0442_ (2026.01); _H10P 72/7402_ (2026.01)

(58) Field of Classification Search
CPC . H01L 2221/68304; H01L 2221/68309; H01L 2221/68318; H01L 2221/68322; H01L 2221/68327; H01L 2221/68336; H01L 2221/68354; H01L 2221/68363; H01L 2221/68381; H01L 2221/68386; H05K 13/0404; H05K 13/0408; H05K 13/041; H05K 13/0411; H05K 13/046; H05K 13/0478; H10P 72/04; H10P 72/0442; H10P 72/0446; H10P 72/50; H10P 72/53; H10P 72/70; H10P 72/74; H10P 72/7402; H10P 72/7408; H10P 72/7412; H10P 72/7414; H10P 72/7416; H10P 72/742; H10P 72/7428; H10P 72/7432; H10P 72/744; H10P 72/7442

See application file for complete search history.

(56) References Cited

U.S. PATENT DOCUMENTS

| | | | | |
|---|---|---|---|---|
| 10,573,544 | B1 | 2/2020 | Radauscher et al. | |
| 2004/0118515 | A1* | 6/2004 | Huang | H01L 21/67132 |
| | | | | 156/707 |
| 2015/0279716 | A1* | 10/2015 | Ko | H01L 21/6836 |
| | | | | 156/716 |
| 2016/0093600 | A1 | 3/2016 | Bower et al. | |
| 2020/0035627 | A1* | 1/2020 | Iguchi | H01B 1/24 |
| 2021/0384062 | A1* | 12/2021 | Plößl | B29C 65/7841 |
| 2024/0290909 | A1* | 8/2024 | Kober | H01L 25/0753 |

* cited by examiner

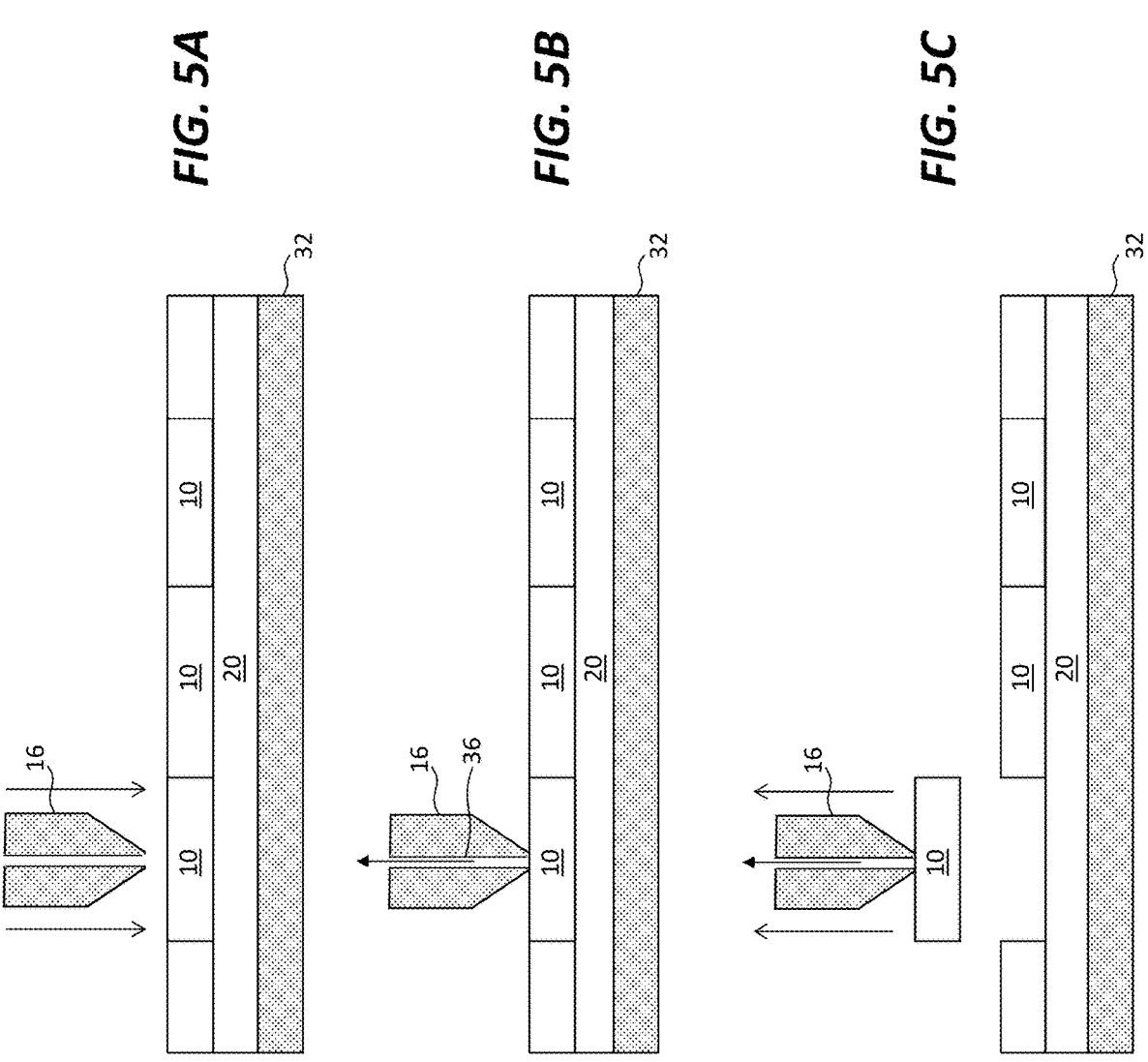

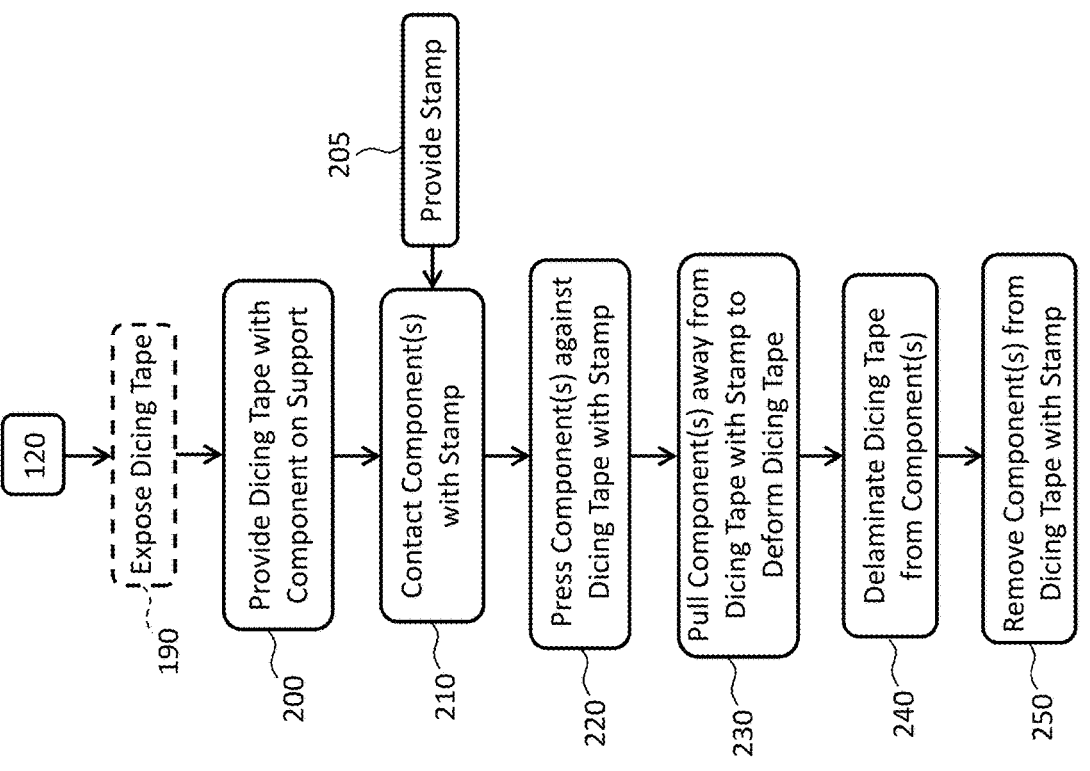

120

190 ⌐ Expose Dicing Tape

205

Provide Stamp

200 — Provide Dicing Tape with Component on Support

210 — Contact Component(s) with Stamp

220 — Press Component(s) against Dicing Tape with Stamp

230 — Pull Component(s) away from Dicing Tape with Stamp to Deform Dicing Tape

240 — Delaminate Dicing Tape from Component(s)

250 — Remove Component(s) from Dicing Tape with Stamp

*FIG. 12*

100 — Provide Wafer with Components

110 — Attach Dicing Tape To Wafer

120 — Singulate Wafer and Components

130 — Contact Components with Pick-and-Place Tools

140 — Remove Components from Adhesive Tape

150 — Contact Components to Target Substrate

160 — Remove Pick-and-Place Tool

*FIG. 11 – Prior Art*

MICRO-TRANSFER PRINTING FROM ADHESIVE SURFACES

TECHNICAL FIELD

This disclosure relates generally to micro-transfer printing components such as small integrated circuits.

BACKGROUND

Integrated circuits are manufactured from semiconductor source wafers such as silicon wafers using photolithographic methods and materials. The semiconductor source wafers can be processed to make many identical integrated circuits, for example using projection lithography tools such as steppers that repeatedly expose a reduced pattern mask (or reticle) over different portions of each semiconductor wafer. Once the integrated circuits are constructed in the semiconductor source wafer, the source wafer is placed on an adhesive dicing tape and the integrated circuits are singulated using a diamond saw, scribe-and-break tool, or laser-scribing tool to separate the individual integrated circuits.

One of several different methods can be used to remove the individual integrated circuits from the dicing tape for packaging. In one approach, one or more ejection pins (poker pins) pierce the tape to push one of the singulated individual integrated circuits from the dicing tape at the same time as a vacuum tool picks up the integrated circuit. Multiple pins can be used with larger integrated circuits and to avoid cracking the integrated circuits. In another method, the dicing tape is peeled off from the back of each integrated circuit. In yet another approach, pins are applied to the back of the integrated circuit and vacuum is applied to the tape to remove it from around the pins so that a vacuum tool can pick up the integrated circuit. None of these methods can be readily applied to small integrated circuits, for example integrated circuits no larger than 100 microns in length or width. Moreover, integrated circuits with thin substrates, for example no greater than 20 microns, can crack when contacted with an ejection pin. Moreover, because the integrated circuits can be very close together on the dicing tape, individual integrated circuits, especially small integrated circuits, are not easily picked up from the dicing tape by a pick-and-place vacuum tool.

In contrast to conventional pick-and-place vacuum tools, micro-transfer printing enables the disposition of very small integrated circuits and other devices from source wafers to target substrates with excellent precision, efficiency, throughput, and source material utilization. For example, components having a length or width from a few microns to a few millimeters and a thickness of 100 nm to 20 microns or more can be released from a source wafer or substrate and transferred with a visco-elastic stamp from the source wafer or substrate to a target substrate using rate-dependent adhesion. The components can be released by under-etching the components so that the components are suspended by a tether attached to an anchor portion of the source wafer or substrate. Examples of micro-transfer printing processes are described in U.S. Pat. No. 8,722,458 entitled Optical Systems Fabricated by Printing-Based Assembly, U.S. Pat. No. 9,358,775 entitled Apparatus and Methods for Micro-Transfer-Printing, and U.S. patent application Ser. No. 14/822,868, filed on Aug. 10, 2015, entitled Compound Micro-Assembly Strategies and Devices.

There is a continuing need in electronic systems for ever-smaller integrated circuits with ever-smaller transistors and a need, therefore, for assembling and packaging such small circuits using methods compatible with existing industrial methods.

SUMMARY

The present disclosure provides, inter alia, devices, structures, systems, and methods for assembling and packaging small integrated circuits or other materials provided on a source wafer with excellent precision, efficiency, throughput, and source material utilization compatible with existing industrial processes.

According to some embodiments of the present disclosure, a method of assembling components comprises providing a stamp, providing a component disposed on an adhesive surface, pressing the stamp against the component to adhere the component to the stamp, pulling the stamp away from the adhesive surface while the component is adhered to the stamp, and removing the component from the adhesive surface with the stamp. The adhesive surface can be a flexible adhesive surface.

In some embodiments, pulling the stamp away from the adhesive surface deforms at least a portion of the adhesive surface in a direction toward the stamp.

In some embodiments, the component disposed on the adhesive surface is adhered to the adhesive surface with a chemical bond. The chemical bond can be UV sensitive and can comprise exposing the tape with UV light after providing the component disposed on the adhesive surface. Some embodiments comprise reducing adhesion between the component and the adhesive surface by applying energy (e.g., electromagnetic radiation, e.g., UV light) to the adhesive surface (e.g., before or during one or more of the pressing, the pulling, or the removing).

In some embodiments, pulling the stamp away from the adhesive surface pulls the component away from the adhesive surface. Pulling the stamp away from the adhesive surface with the stamp can delaminate the adhesive surface from the component. The stamp can be stationary for at least a period of time during the delaminating and the adhesive surface can be suspended in space as the component is delaminated from the adhesive surface.

In some embodiments, the component comprises at least one corner or edge and delaminating the suspended adhesive surface from the component initially delaminates the suspended adhesive surface from the at least one corner or at least one edge of the component. In some embodiments, pulling the stamp away from the adhesive surface causes the adhesive surface to flex, deform, bend, or elastically deform (or any combination of these), and removing the component from the adhesive surface with the stamp occurs while the adhesive surface is flexed, bent, deformed, or elastically deformed. According to some embodiments, the adhesive surface relaxes (e.g., unflexes or undeforms or otherwise at least partially return to its former shape) after the component is removed from the adhesive surface.

In some embodiments, pulling the stamp away from the adhesive surface comprises separating the adhesive surface from a support substrate thereby creating a gap between the adhesive surface and the support substrate and removing the component from the adhesive surface comprises releasing the adhesive surface such that the gap between the adhesive surface and the support substrate at least partially closes or is reduced. An adhesion of a portion of the component to the adhesive surface can be greater than an adhesion of the portion of the component to the stamp for a period of time while removing the component from the adhesive surface with the stamp.

Some embodiments comprise providing a plurality of components disposed on a suspended adhesive surface. The plurality of components can comprise the component.

Methods of the present disclosure can comprise providing components disposed on the adhesive surface, pressing the stamp against each of the components simultaneously to adhere the components to the stamp, pulling the stamp away from the adhesive surface while the components are adhered to the stamp, and simultaneously removing each of the components from the adhesive surface with the stamp. Prior to pressing the stamp against each of the components, methods of the present disclosure can comprise disposing an additional structure over the adhesive surface thereby segregating the components into two or more groups, each of the two or more groups comprising one or more of the components but less than all of the components. The additional structure can comprise (i) at least a portion of a tape frame or (ii) one or more post frames disposed on the stamp. In some embodiments, the components are disposed within a single lattice opening of a tape frame prior to the simultaneous removal of each of the components from the adhesive surface. An additional structure can be disposed in contact with the adhesive surface during the pulling and the removing, thereby facilitating removal of the component from the adhesive surface. The additional structure can comprise (i) at least a portion of a tape frame or (ii) one or more post frames disposed on the stamp.

Some embodiments comprise (i) providing a first component disposed on the adhesive surface and providing a second component disposed on the adhesive surface, (ii) pressing the stamp against the first component and pulling the stamp away from the adhesive surface to remove the stamp and first component from the adhesive surface, and (iii) pressing the stamp against the second component and pulling the stamp away from the adhesive surface to remove the stamp and second component from the adhesive surface. Some embodiments comprise (i) providing a first component disposed on the adhesive surface and providing a second component disposed on the adhesive surface, (ii) pressing the stamp against the first component and the second component at the same time, and (iii) pulling the stamp away from the adhesive surface to remove the first and second from the adhesive surface with the stamp at the same time.

Some embodiments of the present disclosure comprise a tape comprising a tape substrate and the adhesive surface is a surface of the tape substrate of the tape and the tape surface is adjacent to the component. The tape can be flexible, at least partly elastic, or both.

Some embodiments comprise a support substrate disposed on a side of the tape substrate opposite the component. The tape substrate can be held in place on the support substrate with gravity during the pressing. In some embodiments, the tape substrate is not adhered to the support substrate with a chemical bond, or the tape substrate is not held in place on the support substrate with a vacuum or air pressure differential. Some embodiments comprise a tape frame that supports the tape around at least a portion of the tape or around at least a portion of the component (e.g., all of the component). In some embodiments, the tape is held in place on the support substrate only with gravity, a tape frame, or a combination of gravity and the tape frame. In some embodiments, the adhesive surface is suspended by the tape frame and a bottom side of the tape opposite the component does not contact a support except for the tape frame. The tape frame can support the suspended adhesive surface around a perimeter of the suspended adhesive surface.

In some embodiments, the step of pressing the stamp against the component deforms (e.g., a least partially elastically deforms) at least a portion the adhesive surface in a direction away from the stamp.

Some embodiments of the present disclosure comprise providing a plurality of components. The plurality of components can be divided into groups of one or more components disposed on the adhesive surface, a tape comprising a tape substrate, and a tape frame that supports the tape around at least a portion of the tape or component. The tape frame can define two or more lattice openings that divide the components into two or more groups each comprising fewer than all of the components. The adhesive surface can be a surface of the tape substrate adjacent to the component. The adhesive surface can be suspended. The tape frame can support the suspended adhesive surface around one or more groups of components and each group of components can be fewer than all of the components. A group of components can be a single component.

Some embodiments comprise providing groups of one or more components disposed on the adhesive surface, a tape comprising a tape substrate, and a support substrate disposed on a side of the tape substrate opposite the component. The adhesive surface can be a surface of the tape substrate adjacent to the component. The support substrate can support the adhesive surface around one or more groups of components and each group of components can comprise fewer than all of the components, for example one component. The support substrate can provide a vacuum or air pressure differential against only a portion of the adhesive surface or the tape, for example in areas of the adhesive surface or the tape that do not support a component.

Some embodiments of the present disclosure comprise pressing the component with the stamp onto a target substrate to print the component to the target substrate. Some embodiments of the present disclosure comprise aligning the component on the adhesive surface to the stamp using a fiducial mark disposed on any one or more of the components, on the tape, on the adhesive surface, on the support substrate, and on the target substrate.

According to some embodiments of the present disclosure, the component is a component having a length or width, or both a length and a width, no greater than 200 microns (e.g., no greater than 100 microns, no greater than 50 microns, no greater than 20 microns, no greater than 10 microns, no greater than 5 microns, no greater than 2 microns, or no greater than one micron). According to some embodiments of the present disclosure, the component is a component having a thickness no greater than 100 microns (e.g., no greater than 50 microns, no greater than 20 microns, no greater than 10 microns, no greater than 5 microns, no greater than 2 microns, no greater than one micron, no greater than 500 nm, no greater than 200 nm, or no greater than 100 nm).

According to some embodiments of the present disclosure, a micro-transfer-printing system comprises a component disposed on an adhesive surface and a stamp in contact with the component such that the component is temporarily adhered to the stamp. The stamp can pull the component and deform (e.g., elastically deform), bend, or flex the adhesive surface in a direction toward the stamp.

According to some embodiments of the present disclosure, a tape frame supports the tape around at least a portion of the component so that the adhesive surface is suspended.

In some embodiments, the stamp presses against the component and the suspended adhesive surface is deformed in a direction away from the stamp.

Some embodiments comprise a support substrate disposed on a side of the adhesive surface opposite the component. The support substrate can comprise vacuum holes disposed in the support substrate and optionally extending through the support substrate and the method comprises providing a vacuum through the vacuum holes to provide an air pressure differential between only a portion of a side of the adhesive surface or tape in contact with the stamp and a side of the adhesive surface or tape in contact with the support substrate to adhere only a portion of the tape substrate to the support substrate (e.g., wherein the only a portion of the tape substrate is a portion disposed around a perimeter of the component). In some embodiments, a support substrate comprises vacuum holes disposed through the support substrate.

The only a portion of a side of the adhesive surface can be not directly between the component and the support substrate.

A fiducial, alignment, or spatial registration mark can be disposed on or adjacent to the component, tape, adhesive surface, support substrate, or target substrate.

According to some embodiments of the present disclosure, a stamp comprises a bulk portion and a stamp post extending from the bulk portion. In some embodiments a stamp also comprises a post frame extending from the bulk portion and the post frame is disposed around at least a portion of the stamp post to at least partially surround a perimeter of the stamp post. In some embodiments, the post frame completely surrounds the perimeter of the stamp post. The post frame can comprise one or more standoff posts around the stamp post. The post frame can completely surround around the stamp post. Stamps can comprise multiple stamp posts, post frames, or both. The post frame can at least partially surround multiple stamp posts, e.g., at least partially surround two stamp posts, three stamp posts, or four stamp posts. Some embodiments comprise a second stamp post and a second post frame that at least partially surrounds a perimeter of the second stamp post. The second post frame and the post frame can share a common portion (e.g., edge). The second post frame can be entirely separate from the post frame.

The post frame can extend from the bulk portion a post frame distance, the stamp post can extend from the bulk portion a post distance, and the post frame distance can be greater than the post distance. The post frame can extend from the bulk portion a post frame distance, the stamp post can extend from the bulk portion a post distance, and the post distance can be greater than the post frame distance.

According to some embodiments of the present disclosure, a multi-epitaxy structure comprises a substrate, a first epitaxy structure comprising a first crystalline material and disposed on the substrate, wherein the first epitaxy structure has a cleaved perimeter and a first thickness no greater than fifty microns thick (e.g., no greater than forty microns thick, no greater than thirty microns thick, no greater than twenty microns thick, no greater than ten microns thick, or no greater than five microns thick), and a second epitaxy structure comprising a second crystalline material different from the first crystalline material and disposed on the substrate, wherein the second epitaxy structure has a cleaved perimeter and a second thickness no greater than fifty microns thick (e.g., no greater than forty microns thick, no greater than thirty microns thick, no greater than twenty microns thick, no greater than ten microns thick, or no greater than five microns thick). The first epitaxy structure and the second epitaxy structure can be disposed at least partly in a common layer over the substrate.

According to some embodiments of the present disclosure, the first epitaxy structure, the second epitaxy structure, or both the first epitaxy structure and the second epitaxy structure, is or are substantially planar, for example within design and manufacturing tolerances. According to some embodiments of the present disclosure, the first epitaxy structure, the second epitaxy structure, or both the first epitaxy structure and the second epitaxy structure has or have a length, a width, or both a length and a width that is no less than five (e.g., no less than ten, no less than twenty, no less than fifty, or no less than one hundred) times the first thickness of the first epitaxy structure, the second thickness of the second epitaxy structure, or both the first thickness of the first epitaxy structure and the second thickness of the second epitaxy structure. According to some embodiments of the present disclosure, a combined area of the first epitaxy structure and the second epitaxy structure is less than or equal to an area of the substrate.

The first crystalline material can be a semiconductor, the second crystalline material can be a semiconductor, or both the first crystalline material and the second crystalline material can each be a semiconductor. The first crystalline material can be a doped, an implanted, or both a doped and an implanted semiconductor. The second crystalline material can be a doped, an implanted, or both a doped and an implanted semiconductor. The first crystalline material can be a compound semiconductor. The second crystalline material can be a compound semiconductor. In some embodiments, both the first and the second crystalline materials are compound semiconductors.

In some embodiments, the substrate is a semiconductor substrate, for example a silicon substrate, a glass substrate, or a polymer substrate. In some embodiments, the substrate comprises an amorphous material. In some embodiments, the multi-epitaxy structure can comprise a substrate circuit native to (e.g., formed in or on) the substrate, e.g., as a patterned structure in a thin-film semiconductor layer. Some such embodiments comprise a first circuit native to (e.g., formed in or on) the first epitaxy structure, a second circuit native to (e.g., formed in or on) the second epitaxy structure, or both.

In some embodiments, the substrate is a semiconductor substrate, and the multi-epitaxy structure comprises a substrate circuit native to the semiconductor substrate and a thin-film interconnect electrically connecting the substrate circuit to the first circuit, a thin-film interconnect electrically connecting the substrate circuit to the second circuit, or both.

Some embodiments comprise a first circuit native to the first epitaxy structure and a second circuit native to the second epitaxy structure and a thin-film interconnect electrically connecting the first circuit to the second circuit.

In some embodiments, the first epitaxy structure is disposed directly on the substrate, the second epitaxy structure is disposed directly on the substrate, or both.

According to embodiments of the present invention, the cleaved edge is a cracked edge, a melted edge, a vaporized edge, a cut or scribed edge, or a sawn edge.

Some multi-epitaxy structure of the present disclosure comprise an adhesive disposed on the substrate. The first epitaxy structure can be adhered to the substrate with the adhesive, the second epitaxy structure can be adhered to the substrate with the adhesive, or both the first and the second epitaxy structures can be adhered to the substrate with the adhesive. The adhesive can be disposed between the first epitaxy structure and the substrate and can have a first adhesive thickness. The adhesive can be disposed between the second epitaxy structure and the substrate and can have a second adhesive thickness substantially the same as or equal to the first adhesive thickness, for example within design and manufacturing tolerances.

According to some embodiments, the first epitaxy structure has a first surface, and the second epitaxy structure has a second surface substantially parallel to the first surface. The first surface can be substantially in a common plane with the second surface. The first and second epitaxy structures can have a substantially common thickness, e.g., within design and manufacturing tolerances. The first and second epitaxy structures can be similar in any one or more of materials, composition, shape, and size, e.g., within design and manufacturing tolerances.

According to some embodiments, the first epitaxy structure can be a single crystalline structure, the second epitaxy structure can be a single crystalline structure, or both the first epitaxy structure and the second epitaxy structure can each be a single crystalline structure, e.g., within design and manufacturing tolerances.

According to some embodiments of the present disclosure, the first epitaxy structure can have an area no less than 1 mm$^2$ or can have an area no less than 0.34 mm$^2$. Similarly, the second epitaxy structure can have an area no less than 1 mm$^2$ or have an area no less than 0.34 mm$^2$.

According to some embodiments of the present disclosure, the first epitaxy structure is hole-free, the second epitaxy structure is hole-free, or both the first epitaxy structure and the second epitaxy structure are hole-free, for example comprise all points within and including a perimeter of the respective epitaxy structures.

In some embodiments, the first epitaxy structure has an aspect ratio of length to width of no greater than five (e.g., no greater than two, or no greater than 1.5), the second epitaxy structure has an aspect ratio of length to width of no greater than five (e.g., no greater than two or no greater than 1.5), or both.

According to some embodiments of the present disclosure, a multi-epitaxy structure comprises an adhesive tape, a first epitaxy structure comprises a first crystalline material and disposed on the substrate, and a second epitaxy structure comprises a second crystalline material different from the first crystalline material and disposed on the substrate laterally adjacent to the first epitaxy structure.

According to some embodiments, the first epitaxy structure has, the second epitaxy structure has, or the first epitaxy structure and the second epitaxy structure each have a cleaved perimeter and a thickness no greater than fifty microns thick (e.g., no greater than forty microns thick, no greater than thirty microns thick, no greater than twenty microns thick, no greater than ten microns thick, or no greater than five microns thick).

According to some embodiments of the present disclosure, a method of making a multi-epitaxy structure comprises providing a component source wafer, providing an adhesive surface, and providing a stamp, adhering the component source wafer to the adhesive surface, cleaving the component source wafer into separate epitaxy structures, adhering the stamp to one or more of the epitaxy structures, and removing the one or more of the epitaxy structures from the adhesive surface with the stamp. Some methods comprise grinding the source wafer to a desired thickness after adhering the source wafer to the adhesive surface. Some methods comprise providing a handle substrate, adhering the component source wafer to the handle substrate before adhering the component source wafer to the adhesive surface, adhering the component source wafer to the adhesive surface, and removing the handle substrate from the component source wafer. Some methods comprise grinding the component source wafer to a desired thickness after adhering the component source wafer to the handle substrate and before adhering the component source wafer to the adhesive surface.

Methods of the present disclosure can comprise providing a target substrate, contacting the one or more of the epitaxy structures to the target substrate with the stamp to adhere the one or more of the epitaxy structures to the target substrate, and removing the stamp from the target substrate leaving the one or more of the epitaxy structures adhered to the target substrate. The epitaxy structures can each comprise a component.

Methods of the present disclosure comprise providing a component source wafer having a process side opposite a back side, providing a laminate tape, providing a dicing tape, and providing a stamp, adhering the process side of the component source wafer to the laminate tape, grinding the back side of the component source wafer to a desired thickness, adhering the back side of the component source wafer to a dicing tape after the grinding, cleaving the source wafer into separate epitaxy structures, adhering the stamp to one or more of the epitaxy structures, and removing the one or more of the epitaxy structures from the dicing tape with the stamp. Some embodiments comprise providing a target substrate, contacting the one or more of the epitaxy structures to the target substrate with the stamp to adhere the one or more of the epitaxy structures to the target substrate, and removing the stamp from the target substrate leaving the one or more of the epitaxy structures adhered to the target substrate. In some embodiments, the dicing tape comprises a UV-sensitive adhesive and methods of the present disclosure comprise exposing the UV-sensitive adhesive to UV radiation to reduce an adhesion of the UV-sensitive tape to the one or more of the epitaxy structures before removing the one or more of the epitaxy structures from the dicing tape with the stamp.

BRIEF DESCRIPTION OF THE DRAWINGS

Drawings are presented herein for illustration purposes, not for limitation. Drawings are not necessarily drawn to scale. The foregoing and other objects, aspects, features, and advantages of the disclosure will become more apparent and may be better understood by referring to the following description taken in conjunction with the accompanying drawings, in which:

FIGS. 5A-5F are sequential cross sections of structures in an assembly process using a vacuum-based pick-and-place tool usable in understanding embodiments of the present disclosure;

FIG. 11 is a flow diagram describing a dicing process useful in understanding embodiments of the present disclosure;

FIG. 12 is a flow diagram describing micro-transfer printing a component from a tape with an adhesive surface on a support substrate with a visco-elastic stamp according to illustrative embodiments of the present disclosure;

Figure 1:
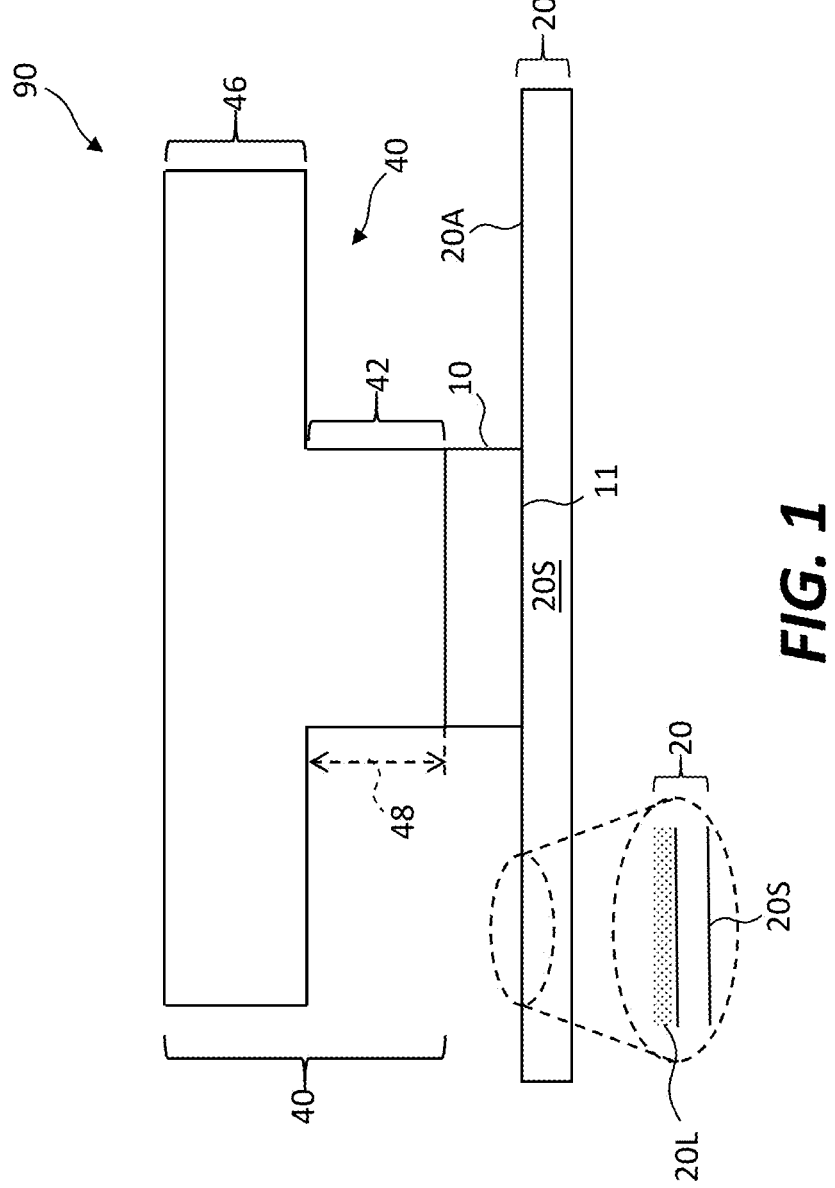
FIG. 1 is a cross section and detail of a component adhered to an adhesive surface of a tape according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not necessarily drawn to scale. The vertical scale of the Figures can be exaggerated to clarify the illustrated structures.

DETAILED DESCRIPTION OF CERTAIN EMBODIMENTS

Certain embodiments of the present disclosure provide, inter alia, methods, devices, and structures suitable for transferring (e.g., micro-transfer printing or micro-assembling) components (e.g., micro-components, devices, or micro-devices) disposed on an adhesive surface (e.g., an adhesive surface of a tape such as a dicing tape) from the adhesive surface to a target substrate with excellent precision and at high transfer rates. Such micro-assembled micro-components can be micro-assembled using micro-transfer printing. The components are formed on a wafer using photolithographic methods and materials, adhered to the adhesive surface, singulated, and individually transferred from the adhesive surface with a stamp to a target substrate.

As illustrated in FIG. 1, and according to some embodiments of the present disclosure, a micro-transfer-printing system 90 can comprise a component 10 disposed on an adhesive surface 20A and a stamp 40 in contact with component 10 to adhere component 10 to stamp 40. Adhesive surface 20A can be disposed on a tape substrate 20S. Adhesive surface 20A can be a surface of tape substrate 20S or can be an adhesive layer 20L disposed on tape substrate 20S. Adhesive surface 20A (or adhesive layer 20L) and tape substrate 20S can be comprised in a tape 20. Tape 20 and adhesive surface 20A can be flexible and tape substrate 20S can be at least partially clastic so that, if tape 20 and adhesive surface 20A is deformed, tape 20 can take on a shape different from the deformation, e.g., return at least partially to its shape before the deformation.

Adhesive surface 20A or adhesive layer 20L adheres to component 10 with an adhesive force when component 10 is contacted thereto. (Adhesive surface 20A or adhesive layer 20L acts as an adhesive.) Adhesion between an adhesive surface 20A or adhesive layer 20L and component 10 is greater than any intermolecular force absent adhesive surface 20A or adhesive layer 20L (e.g., between an underlying substrate and component 10). The adhesive force can apply chemical adhesion, dispersive adhesion, or both. For example, adhesive surface 20A or adhesive layer 20L can be or comprise a chemical adhesive providing a chemical bond that can be a lasting attraction between atoms, ions or molecules. The bond may result from the electrostatic force of attraction between oppositely charged ions as in ionic bonds or through the sharing of electrons as in covalent bonds. In some embodiments, the chemical bond can, but does not necessarily, enable the formation of chemical compounds. Adhesive surface 20A or adhesive layer 20L can be tacky, sticky, or both. Adhesive surface 20A or adhesive layer 20L can inhibit, but not prevent, the separation of component 10 from adhesive surface 20A. In some embodiments, component 10 is adhered to adhesive surface 20A with a force greater than gravity. In some embodiments, in the absence of adhesive surface 20A, component 10 can fall off tape 20, e.g., by the force of gravity or by mechanically moving or shaking tape 20 and component 10, e.g., gentle shaking, but in the presence of adhesive surface 20A, component 10 remains adhered to tape 20, e.g., despite the force of gravity or mechanically moving or shaking tape 20 and component 10. A dispersive adhesion applied to component 10 by adhesive surface 20A or adhesive layer 20L can include one, or a combination, of a London dispersion force, a Keesom force, a Debye force, and hydrogen bonding. In general, adhesive surface 20A or adhesive layer 20L can comprise (e.g., be made of) any suitable adhesive material(s) (e.g., composition, compound, molecule). A suitable adhesive material is one that can supply adhesion without permanently adhering component 10 thereto such that a transfer device, like stamp 40, can still be used to separate component 10 from adhesive surface 20A or adhesive layer 20L.

Stamp 40 can, but does not necessarily, comprise an elastomeric, visco-elastomeric material such as PDMS that exhibits rate-dependent adhesion. Stamp 40 material, such as PDMS, can be any one of flexible, compressible, stretchable, and elastic. Stamp 40 can comprise a stamp bulk layer 46 and a stamp post 42 extending from stamp bulk layer 46 a post distance 48. A distal end of stamp post 42 can be in contact with component 10 and adhere component 10 to stamp post 42 with, for example, van der Waals forces. In some embodiments of the present disclosure, stamp 40 and stamp post 42 can press against component 10 with a compressive force (compression) to push component 10 toward adhesive surface 20A or pull component 10 with a tensile force (tension) to pull component 10 away from adhesive surface 20A. For clarity of exposition, stamp 40 is described as over component 10, component 10 is over and on the top of adhesive surface 20A, and up or upwards is a direction from adhesive surface 20A toward stamp 40. Conversely, adhesive surface 20A is described as below or beneath component 10, adhesive surface 20A is on a bottom side 11 (a bottom surface) of component 10, and down or downwards is a direction from stamp 40 toward adhesive surface 20A. However, as will be appreciated by those knowledgeable in the art, up and down, top and bottom, over and under, and above and below are relative terms that can be interchanged (e.g., for different systems having different orientations).

Figure 2A:
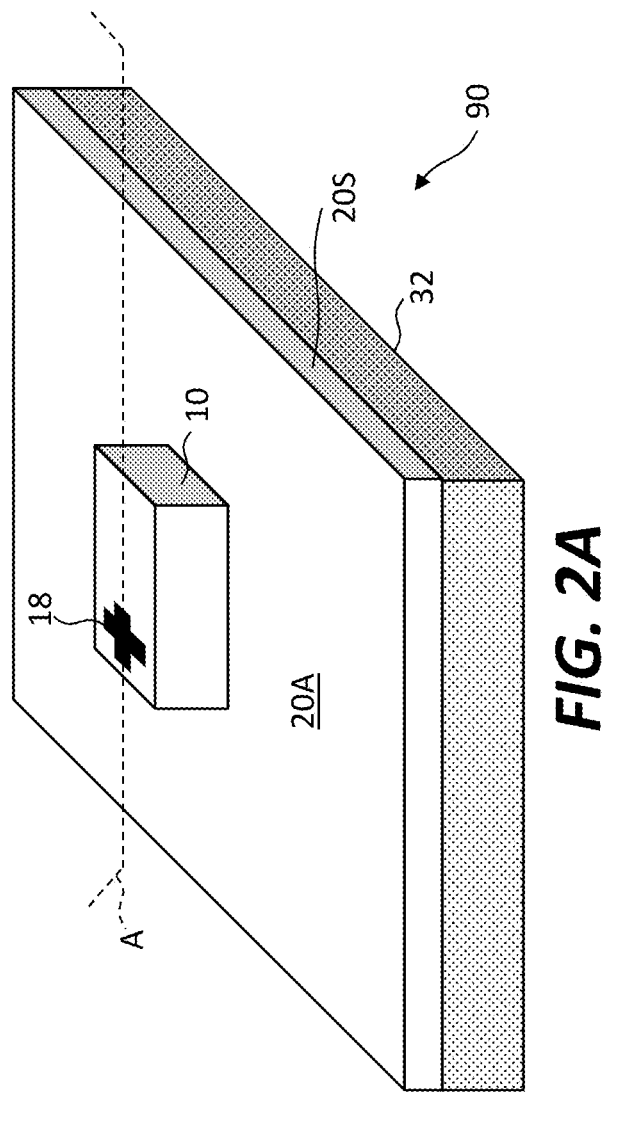
FIG. 2A is a perspective of a component adhered to an adhesive surface of a tape on a support substrate with a tape frame according to illustrative embodiments of the present disclosure.
Figure 2B:
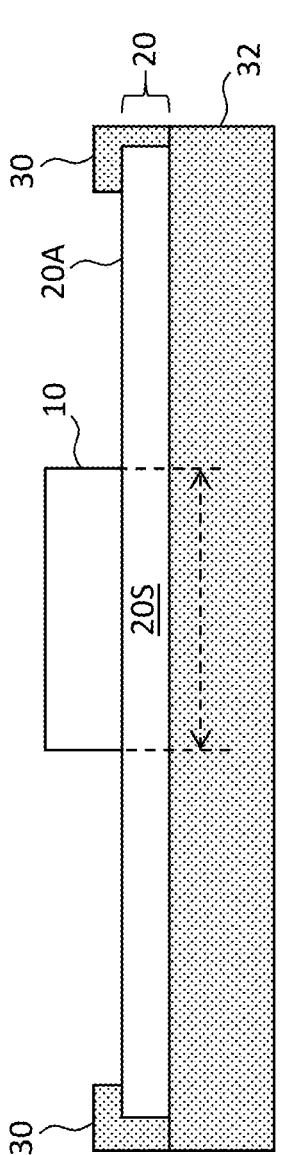
FIG. 2B is a cross section taken across cross section line A of FIG. 2A according to illustrative embodiments of the present disclosure.

Adhesive surface 20A can be an adhesive surface or adhesive layer 20L of or on tape substrate 20S comprising tape 20. As shown in FIGS. 2A and 2B, tape 20 can be disposed on a support substrate 32 with adhesive surface 20A on a side of tape substrate 20S opposite support substrate 32 so that adhesive surface 20A is exposed. In some embodiments of the present disclosure, tape 20 and tape substrate 20S are not adhered to support substrate 32, e.g., with an adhesive, chemical bond, or an air pressure differential, at least in an area between component 10 and support substrate 32; the area is indicated with the dashed lines and arrow in FIG. 2B. For example, tape 20 can be held in place on support substrate 32 with gravity or with tape frame 30 in combination with support substrate 32. (Tape frame 30 is omitted from FIG. 2A for clarity but can extend around a perimeter of tape 20, for example as shown in FIG. 2B.)

Figure 3A:
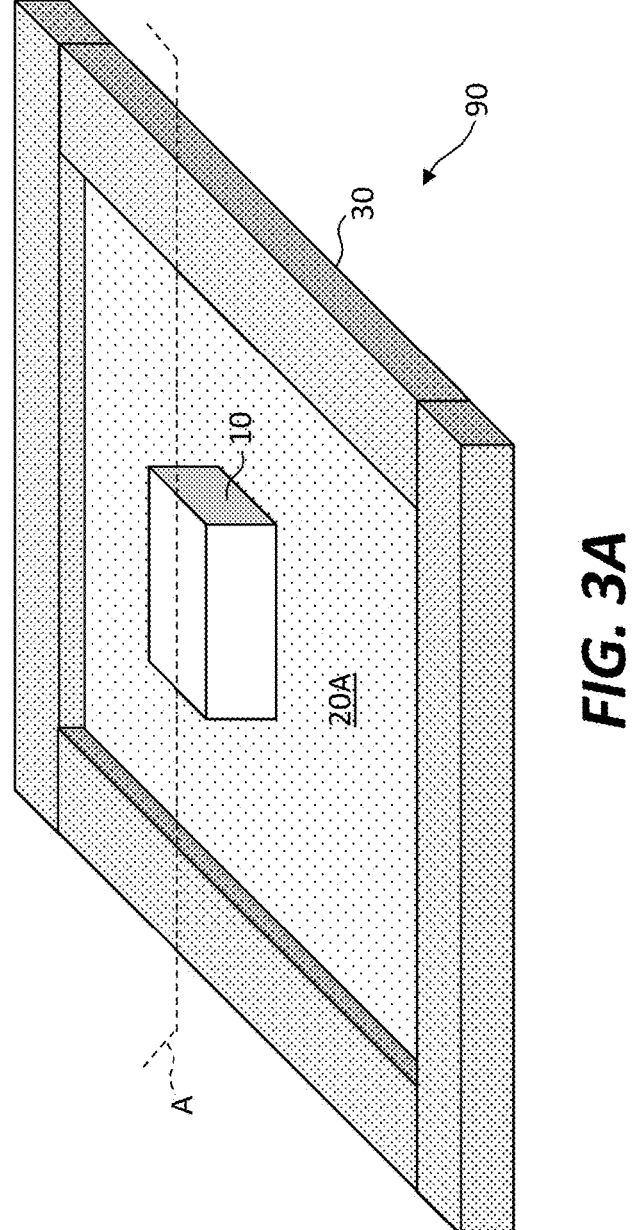
FIG. 3A is a perspective of a component adhered to an adhesive surface of a tape suspended by a frame according to illustrative embodiments of the present disclosure.
Figure 3B:
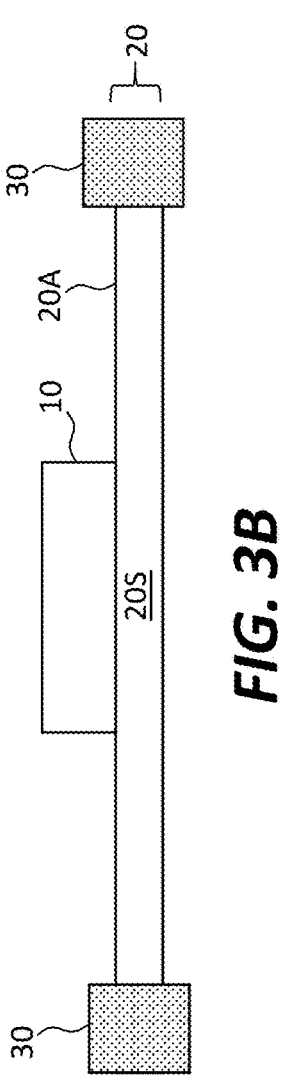
FIG. 3B is a cross section taken across cross section line A of FIG. 3A according to illustrative embodiments of the present disclosure.

In some embodiments and as illustrated in FIGS. 3A and 3B, a micro-transfer-printing system 90 comprises a tape frame 30 that supports tape 20 around at least a portion of component 10 so that at least a portion of adhesive surface 20A is suspended. Tape frame 30 can extend below and optionally above adhesive surface 20A so that adhesive surface 20A and tape substrate 20S does not contact another surface or physical structure beneath component 10 and component 10 is suspended on tape 20.

Figures 4A, 4B, 4C, 4D:
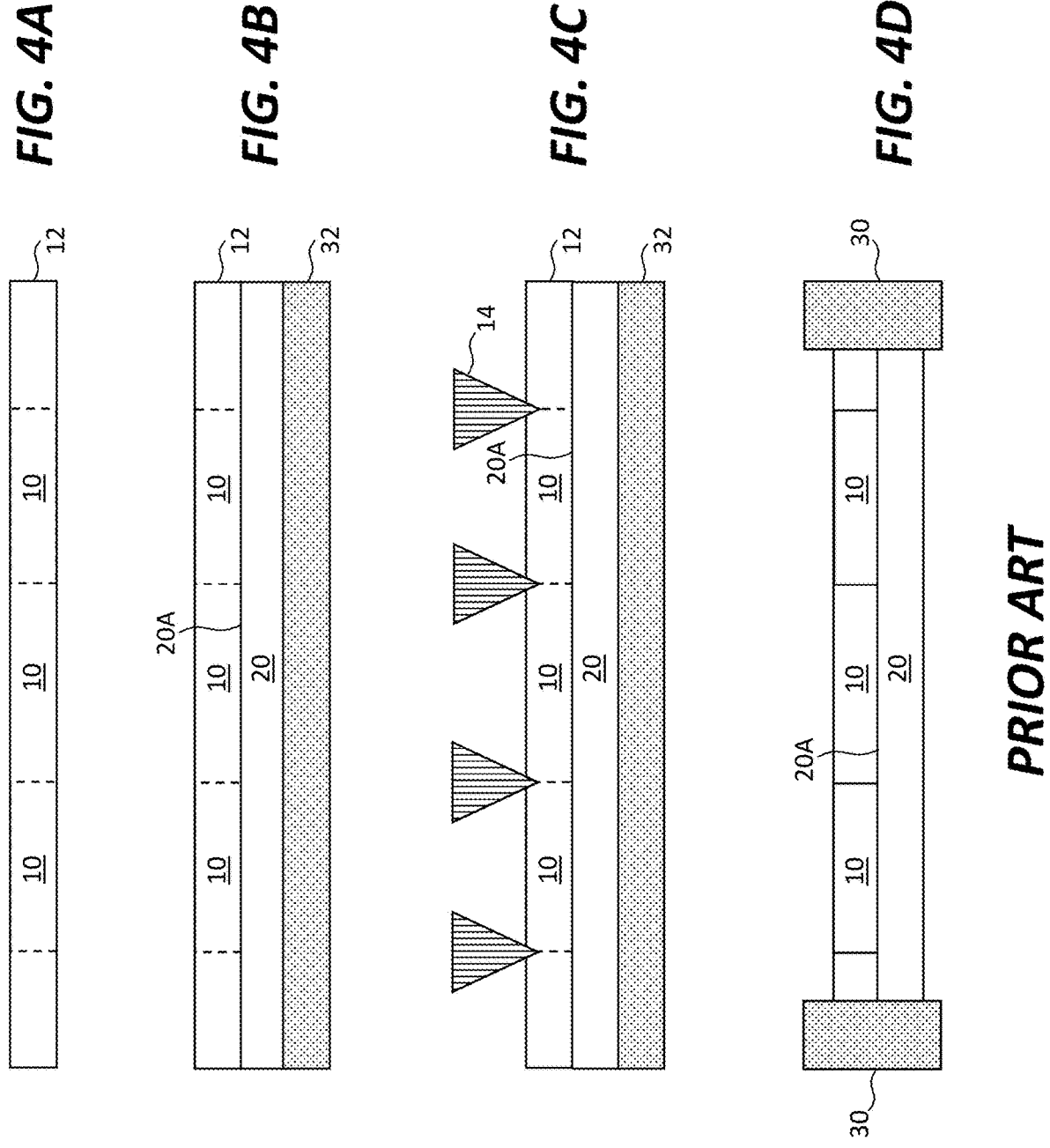
FIGS. 4A-4D are sequential cross sections of structures in a dicing process usable in embodiments of the present disclosure.

Components 10 can be disposed on adhesive surface 20A and singulated as illustrated in the sequential structures of FIGS. 4A-4D and described in the flow diagram of FIG. 11. Components 10 made on or in, for example by photolithography, and native to a component source wafer 12 (a component substrate) are provided, as shown in FIG. 4A in step 100. Component source wafer 12 is adhered to an adhesive surface 20A of a tape 20, as shown in FIG. 4B in step 110. FIG. 4B also illustrates an optional support substrate 32 (e.g., an anvil) beneath tape 20. As shown in FIG. 4C, components 10 are singulated from component source wafer 12 in step 120. Singulation can be accomplished in a variety of ways. In some ways, component source wafer 12 is sawn, for example with a diamond saw to provide individual components 10 adhered to tape 20. In some methods, as shown in FIG. 4C, a scribe 14 (e.g., a diamond-tipped scribing tool) scores lines on component source wafer 12, component source wafer 12 is supported by a tape frame 30 (e.g., with a hoop or rectangular support around the perimeter of tape 20), and bent (mechanically stressed e.g., with a roller breaker or impulse bar) to crack component source wafer 12 along the scribe lines, as shown in FIG. 4D. Component source wafer 12 can also be scored, cracked, or singulated using a laser, e.g., using laser ablation to form scribe lines or completely separate components 10 from component source wafer 12. The end result of the singulation process is singulated, individual, and separate components 10 adhered to adhesive surface 20A of tape 20. Unless otherwise clear from context, reference herein to one or more components 10 refers to individual (e.g., singulated) component(s) 10, not component(s) 10 within a common physical structure that includes multiple copies of the same component (e.g., a pre-dicing or pre-scribing structure).

Figures 5D, 5E, 5F:
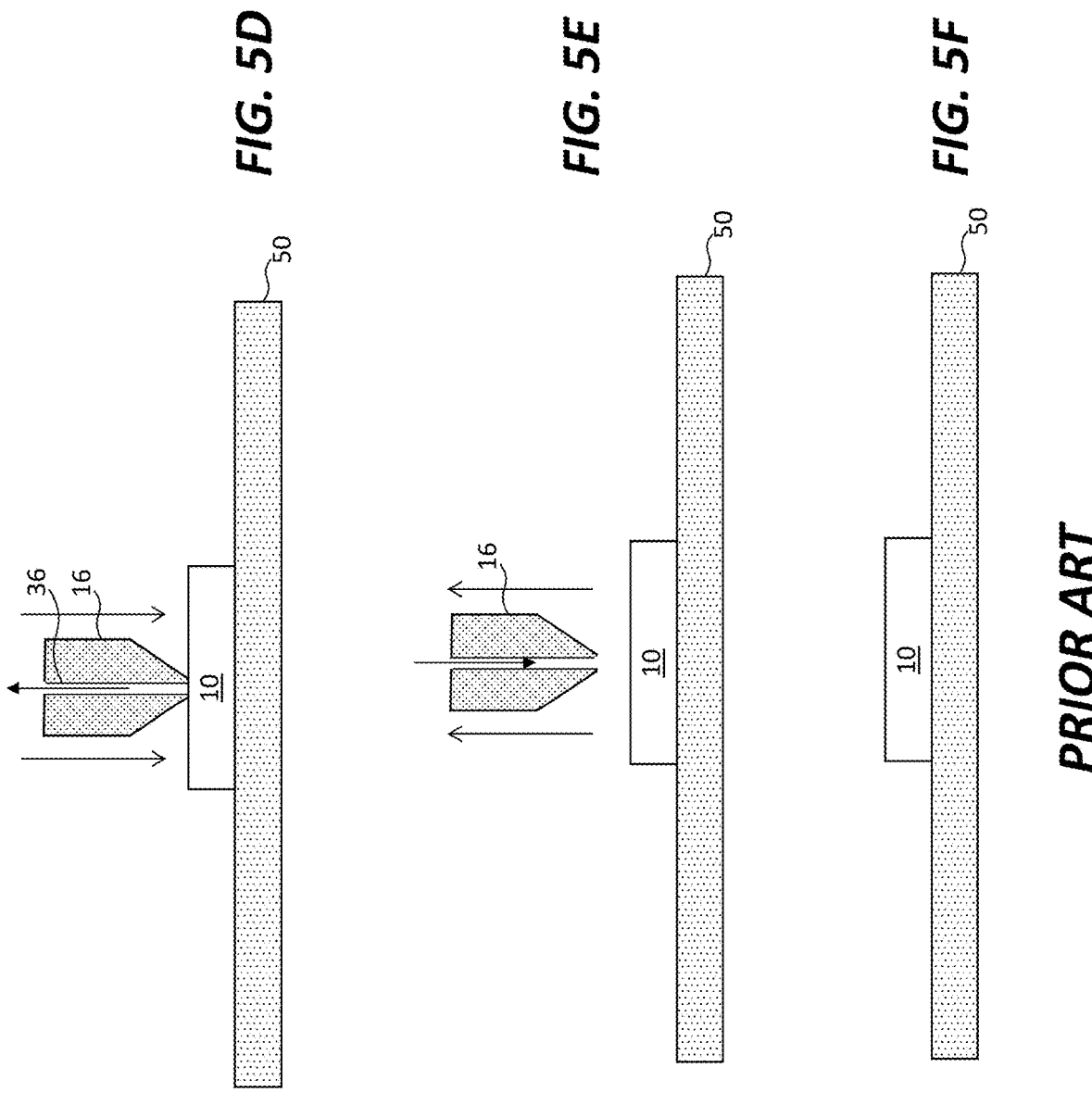

According to prior "pick and place" methods, once components 10 are singulated, detached from component source wafer 12, and adhered to adhesive surface 20A, components 10 can be removed from adhesive surface 20A as shown in FIGS. 5A-5F. As shown in FIG. 5A, a pick-and-place tool 16 with a vacuum-based gripper is located adjacent to component 10, a vacuum (or reduced air pressure) is supplied to pick-and-place tool 16 and a top side of component 10 opposite adhesive surface 20A through vacuum hole 36 where the arrow illustrates the motion of air molecules to provide differential air pressure, as shown in FIG. 5B, to adhere component 10 to pick-and-place tool 16 with air pressure in step 130. As shown in FIG. 5C, pick-and-place tool 16 is then removed from tape 20 and component source wafer 12 with component 10 in step 140 and, as shown in FIG. 5D, component 10 is contacted and adhered to a target substrate 50 in step 150. Target substrate 50 can be, for example a printed circuit board. Air pressure is no longer applied through vacuum hole 36 of pick-and-place tool 16 to component 10 (or reversed to push component 10 away from pick-and-place tool 16 with air pressure) and pick-and-place tool 16 removed (in step 160 and as shown in FIG. 5E), leaving component 10 adhered to target substrate 50, as shown in FIG. 5F. An adhesive layer can be disposed on target substrate 50 to facilitate bonding component 10 to target substrate 50 before step 150. Because high gripping forces can be applied using vacuum pick-and-place tools, no treatment of adhesive surface 20A is required to facilitate component 10 removal (gripping force can always greatly exceed adhesive forces).

Figures 6A, 6B:
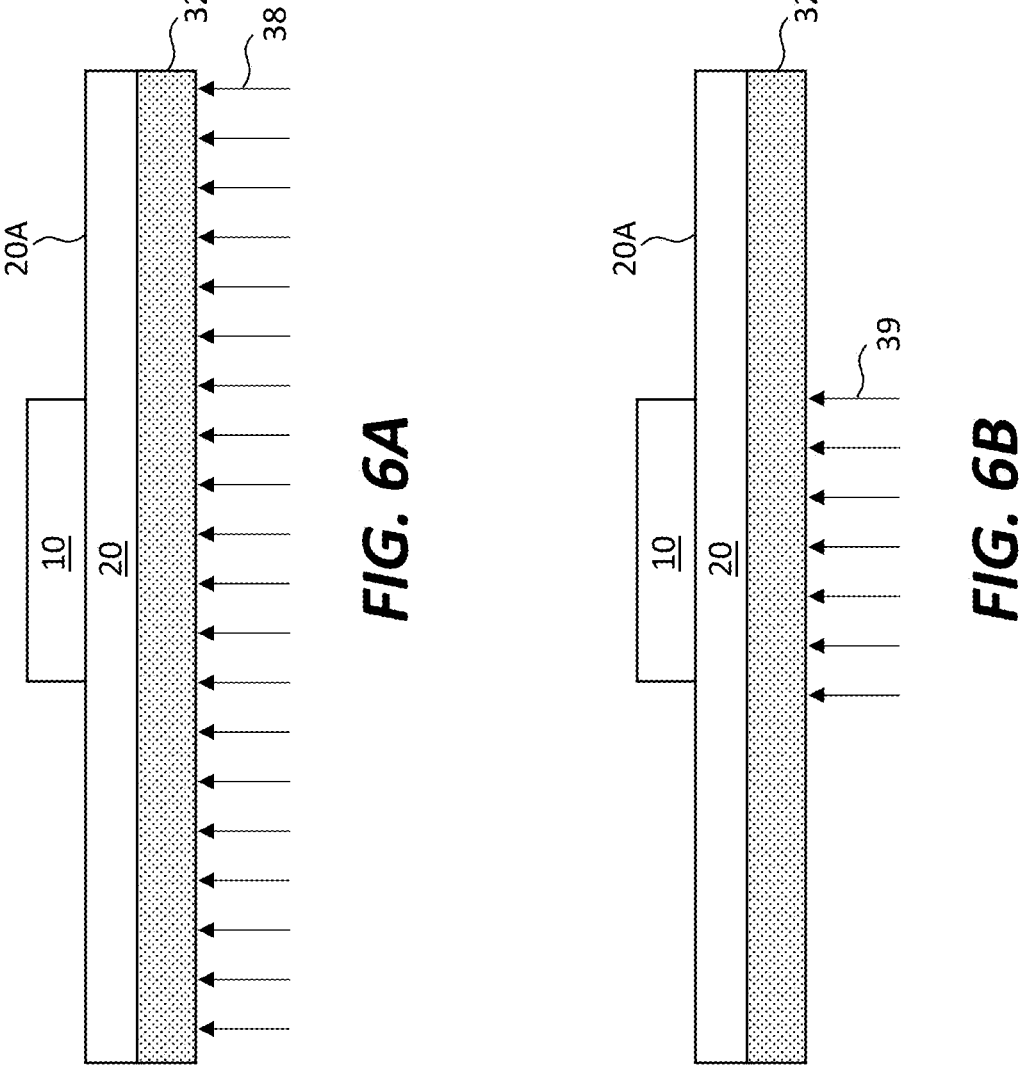
FIG. 6A is a cross section of an exposure with radiation of the adhesive surface of FIGS. 2A-2B according to illustrative embodiments of the present disclosure.
FIG. 6B is a cross section of a patterned exposure with radiation of the adhesive surface of FIGS. 2A-2B according to illustrative embodiments of the present disclosure.

In some embodiments of the present disclosure, component 10 is removed from adhesive surface 20A with a stamp 40. In order to assist the removal process, the adhesive strength of adhesive surface 20A can be reduced by using a light-sensitive adhesive (e.g., an ultra-violet light-sensitive adhesive) on or as adhesive surface 20A to reduce the necessary adhesive strength between stamp post 42 and component 10 improving the ability of stamp 40 to remove component 10 from adhesive surface 20A. A light-sensitive adhesive can reduce the adhesive strength of the adhesive by exposing the adhesive to light. For example, the adhesive strength of a UV-sensitive (ultra-violet sensitive) adhesive on tape 20 can be reduced by exposure to UV radiation 36, as illustrated in FIG. 6A. In some embodiments, radiation 38 is patterned to provide patterned radiation 39, as illustrated in FIG. 6B, for example the adhesive strength between component 10 and tape substrate 20S is reduced by exposing the adhesive surface 20A between component 10 and tape substrate 20S to patterned radiation 39 before removing component 10 from adhesive surface 20A with stamp 40. The remainder of adhesive surface 20A can be unexposed to patterned radiation 39 and unaltered.

Figure 7A:
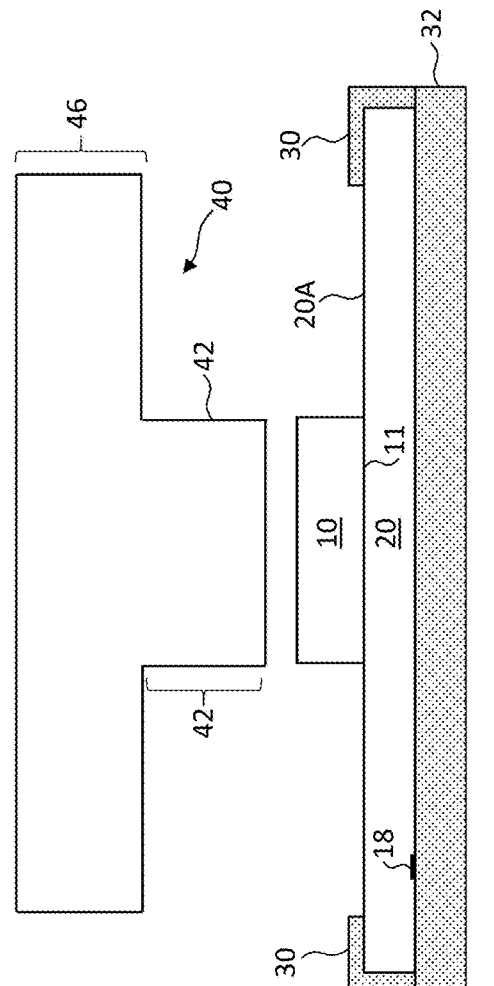
FIGS. 7A-7I are sequential cross sections of structures in a micro-transfer printing process for components from an adhesive surface on a support substrate to a target substrate using a visco-elastic stamp according to illustrative embodiments of the present disclosure.
Figure 7B:
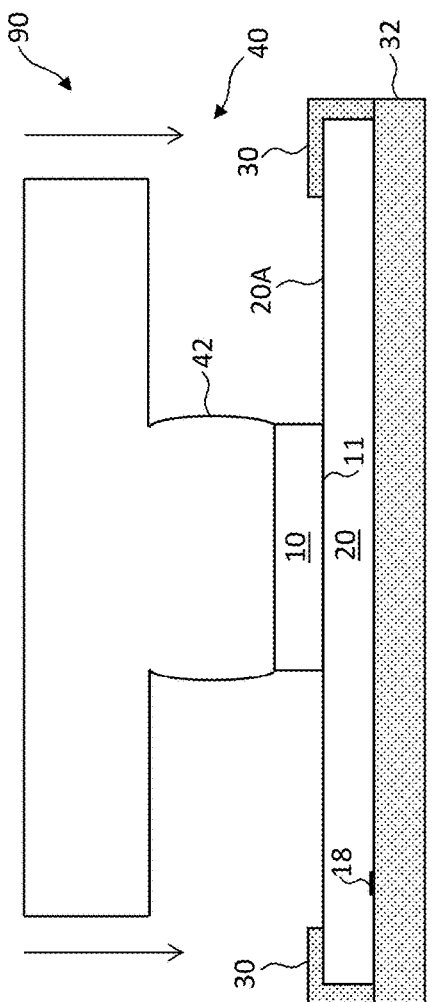

In contrast to methods using pick-and-place tools 16 and according to some embodiments of the present invention, and as shown in the successive structures of FIGS. 7A-7I and the flow diagram of FIG. 12, a method of assembling component 10 comprises providing dicing tape 20 with one or more components 10 disposed on adhesive surface 20A in step 200 (e.g., after step 120 or optionally after step 190)

with component bottom side 11 adjacent to adhesive surface 20A adhered to adhesive surface 20A. Stamp 40 can be provided in step 205 and as illustrated in FIG. 7A. Adhesive surface 20A optionally can be exposed to adhesion-reducing patterned radiation 39 in step 190 and as described with respect to FIGS. 6A and 6B. In some embodiments of the present disclosure, tape 20 is provided on support substrate 32, but not effectively adhered to support substrate 32. Stamp post 42 of stamp 40 is contacted to component 10 in step 210 and pressed against component 10 to adhere component 10 to stamp post 42 of stamp 40, for example with van der Waals forces, in step 220 and as shown in FIG. 7B. Stamp 40 can provide a compressive force on stamp post 42 against a top side of component 10 opposite adhesive surface 20A. (The bulge of stamp post 42 in FIG. 7B indicates the compressive force provided by pressing stamp 40 toward adhesive surface 20A and is not drawn to scale.) Adhesive surface 20A can be an adhesive surface of or adhesive layer 20L on tape substrate 20S of tape 20. At this step, component 10 is adhered to both adhesive surface 20A (e.g., with a chemical bond) and a distal end of stamp post 42 (e.g., with van der Waals forces). The van der Waals adhesion between stamp post 42 and component 10 can be, but is not necessarily, stronger than the adhesion between component 10 and adhesive surface 20A.

Figure 7C:
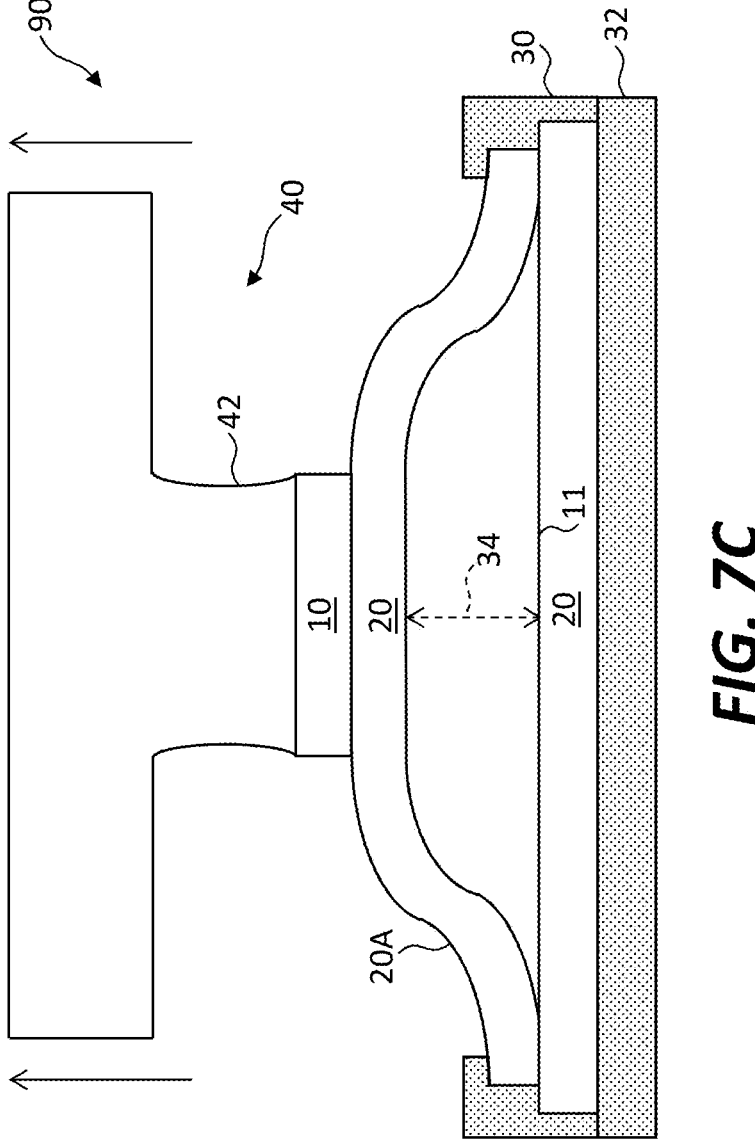
Figure 7D:
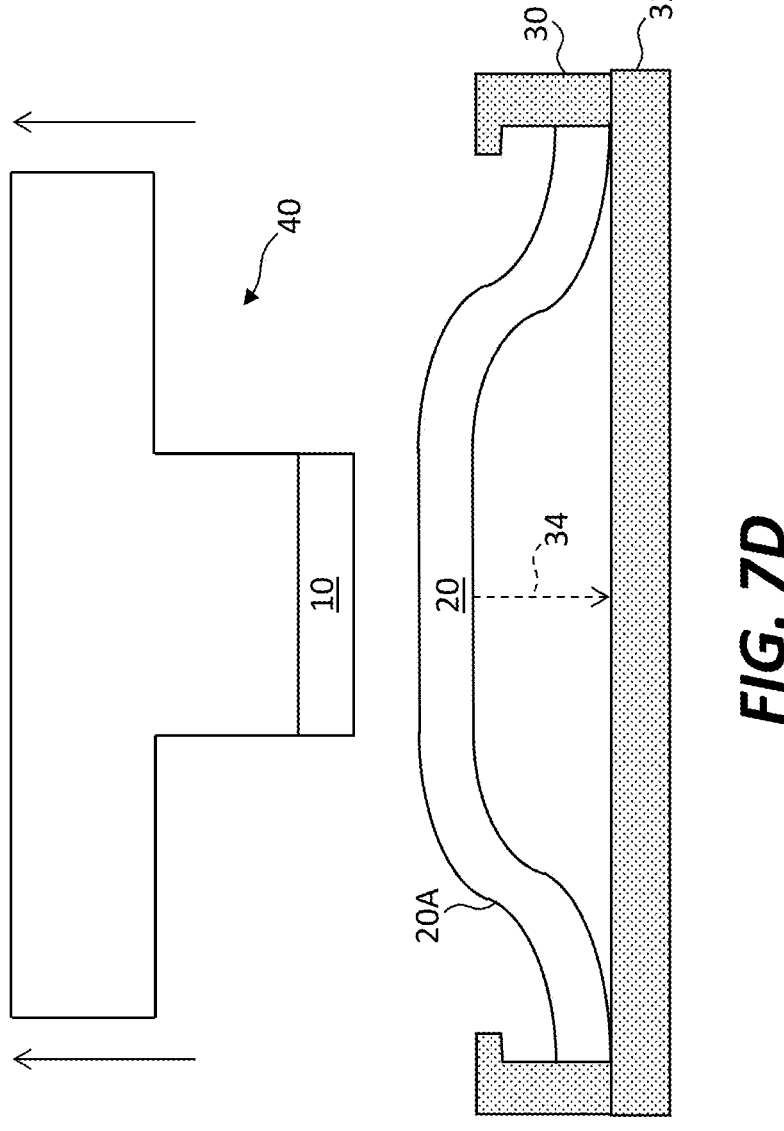
Figure 7E:
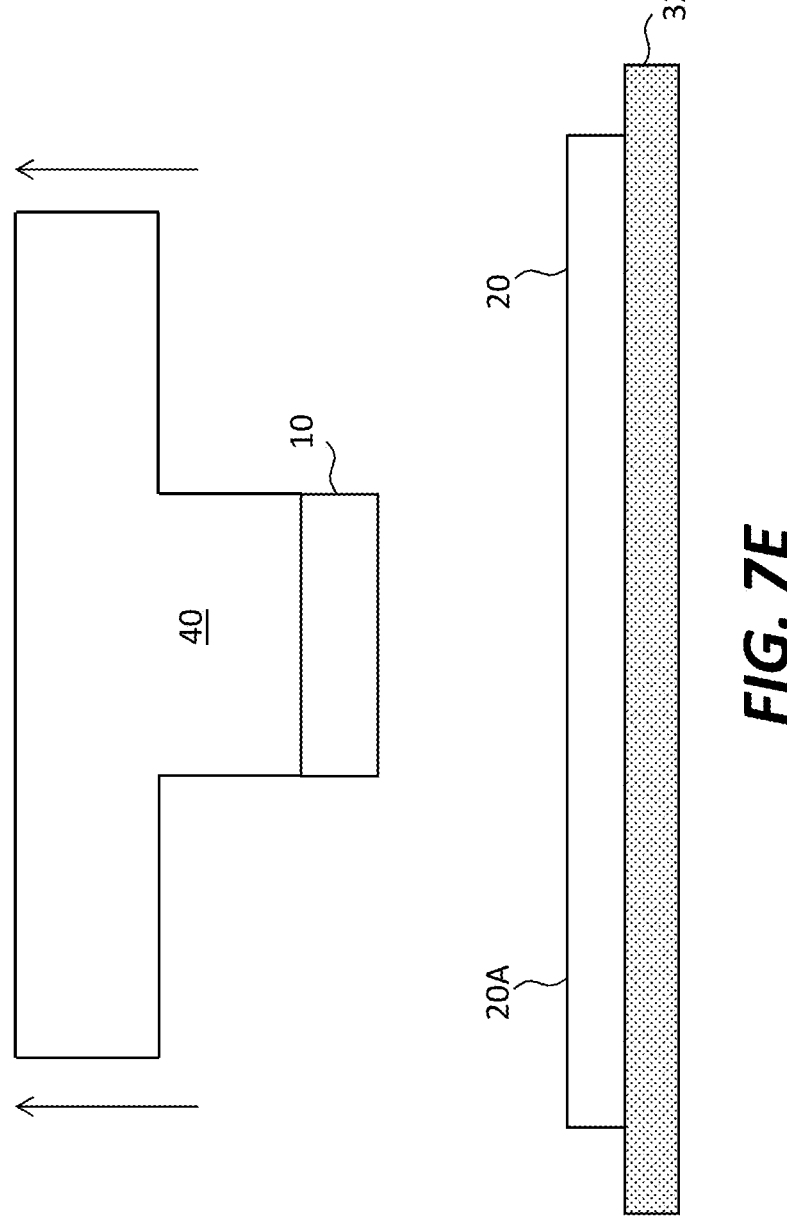

Stamp 40 is then pulled away from adhesive surface 20A in step 230 as shown in FIG. 7C so that adhesive surface 20A is pulled in a direction toward stamp 40 and component 10 and away from support substrate 32. However, because there is not a strong adhesion, or effectively no adhesion, between adhesive surface 20A of tape 20 and support substrate 32 (e.g., between tape 20 and support substrate 32), component 10 and adhesive surface 20A of tape 20 are pulled away from support substrate 32 forming a gap 34 between tape 20 and support substrate 32 in step 230, flexing, bending, or deforming (or any combination of these, e.g., temporarily, e.g., elastically deform) a least a portion of tape 20 and adhesive surface 20A. Without wishing to be bound by any particular theory, because the van der Waals adhesion between stamp post 42 and component 10 can be stronger than the adhesion between component 10 and adhesive surface 20A, as stamp 40 continues to pull away from adhesive surface 20A, adhesive surface 20A can eventually delaminate from component 10 in step 240, leaving component 10 adhered to stamp post 42 of stamp 40 and removing component 10 from adhesive surface 20A of tape substrate 20S of tape 20 in step 250 and as shown in FIGS. 7D and 7E. Adhesive surface 20A and tape 20 can thus relax (e.g., unflex, undeform, or otherwise at least partially return to its former shape) once component 10 has been removed thereby at least partially closing gap 34.

Figure 7F:
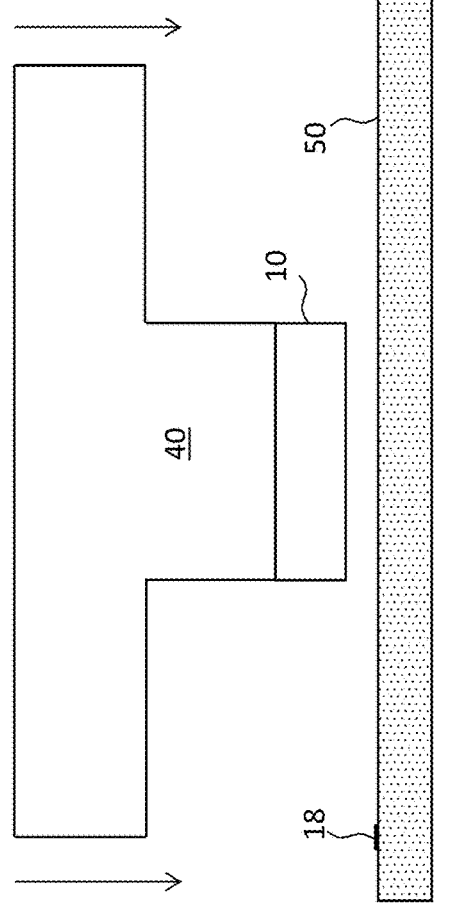
Figure 7G:
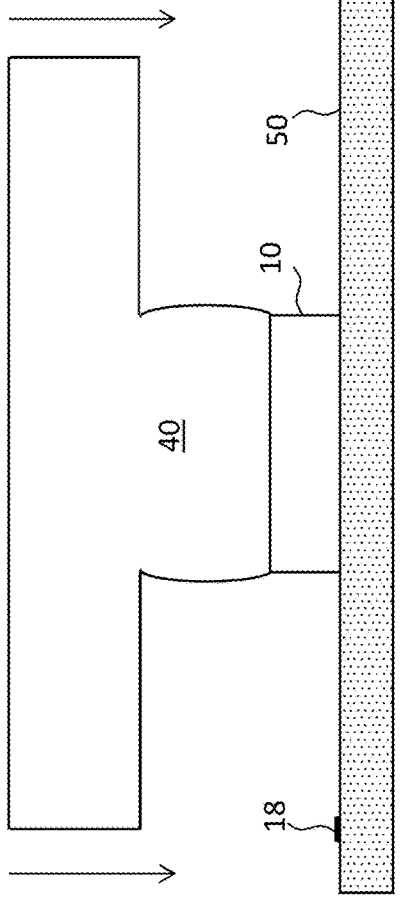
Figures 7H, 7I:
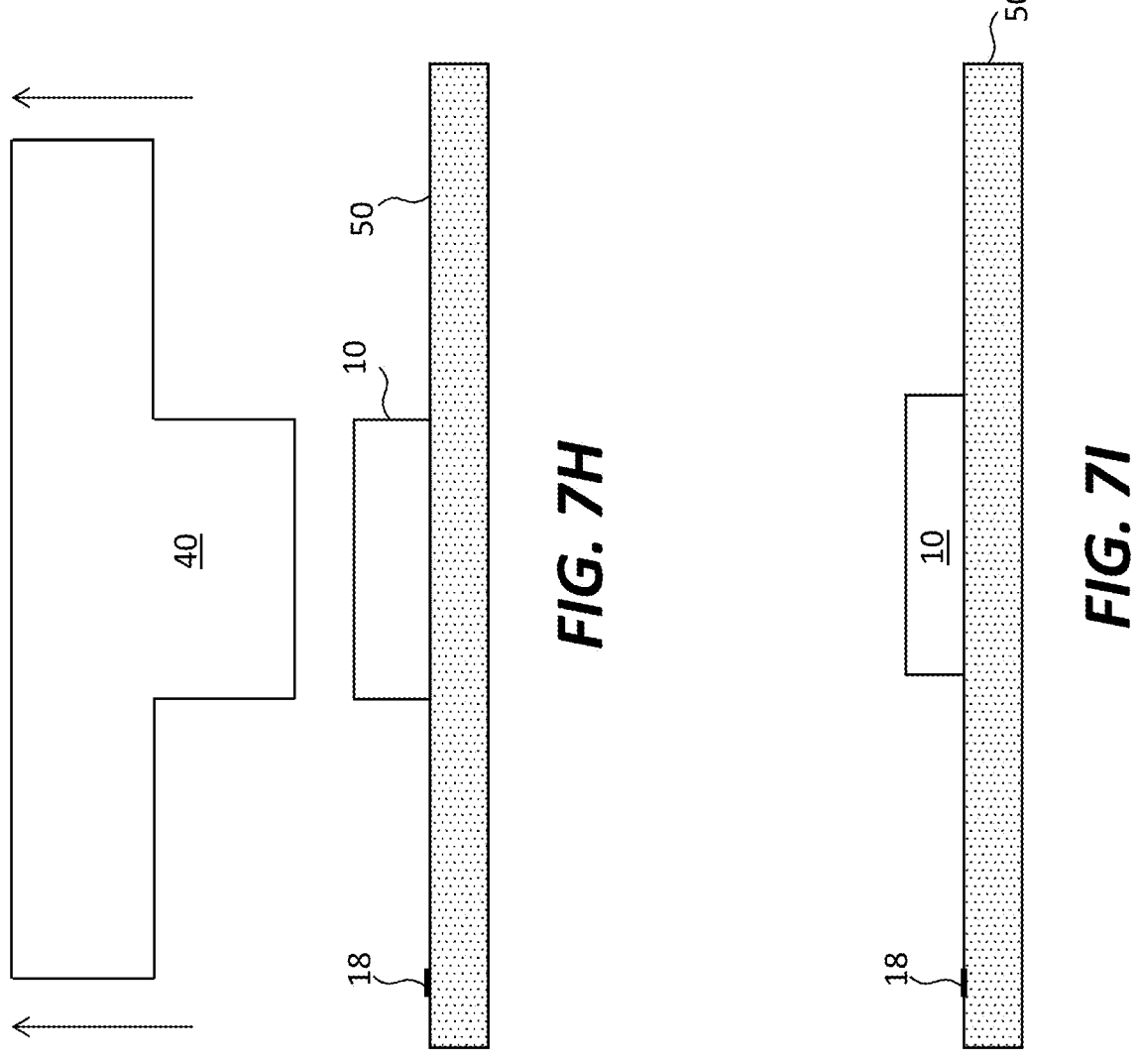
Figure 13:
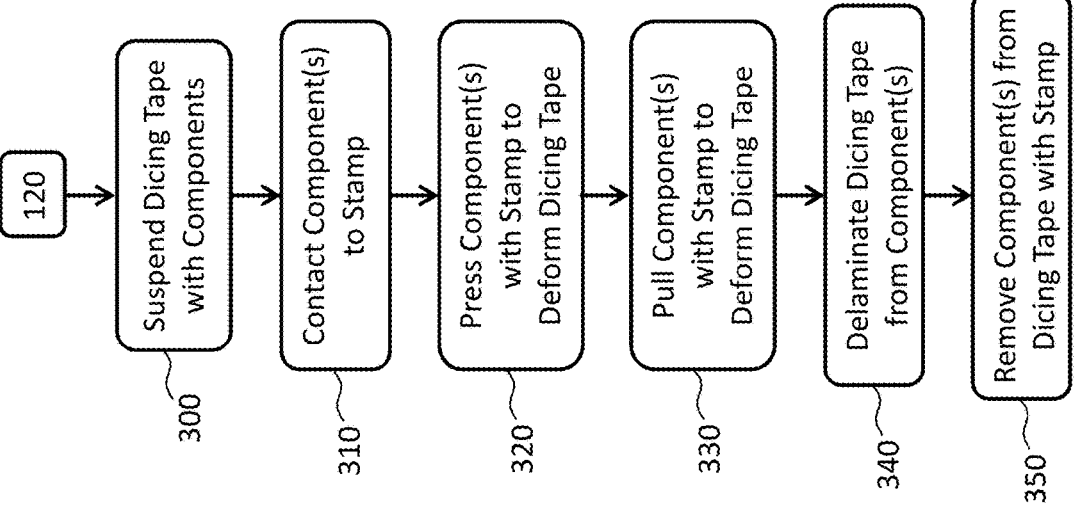
FIG. 13 is a flow diagram illustrating micro-transfer printing a component on a visco-elastic stamp to a target substrate according to illustrative embodiments of the present disclosure.

In some embodiments and as shown in FIG. 7F and as described in the flow diagram of FIG. 13, stamp 40 with adhered component 10 can be located adjacent to a target substrate 50 (that is optionally coated with an adhesive layer, not shown) in step 400. Component 10 can be contacted to a surface of target substrate 50 or an adhesive layer disposed on the surface of target substrate 50 with stamp 40 in step 410 and adhered to target substrate 50 in step 420 and as shown in FIG. 7G. As shown in FIG. 7H, stamp 40 is removed in step 430, leaving component 10 adhered to target substrate 50.

Figure 8:
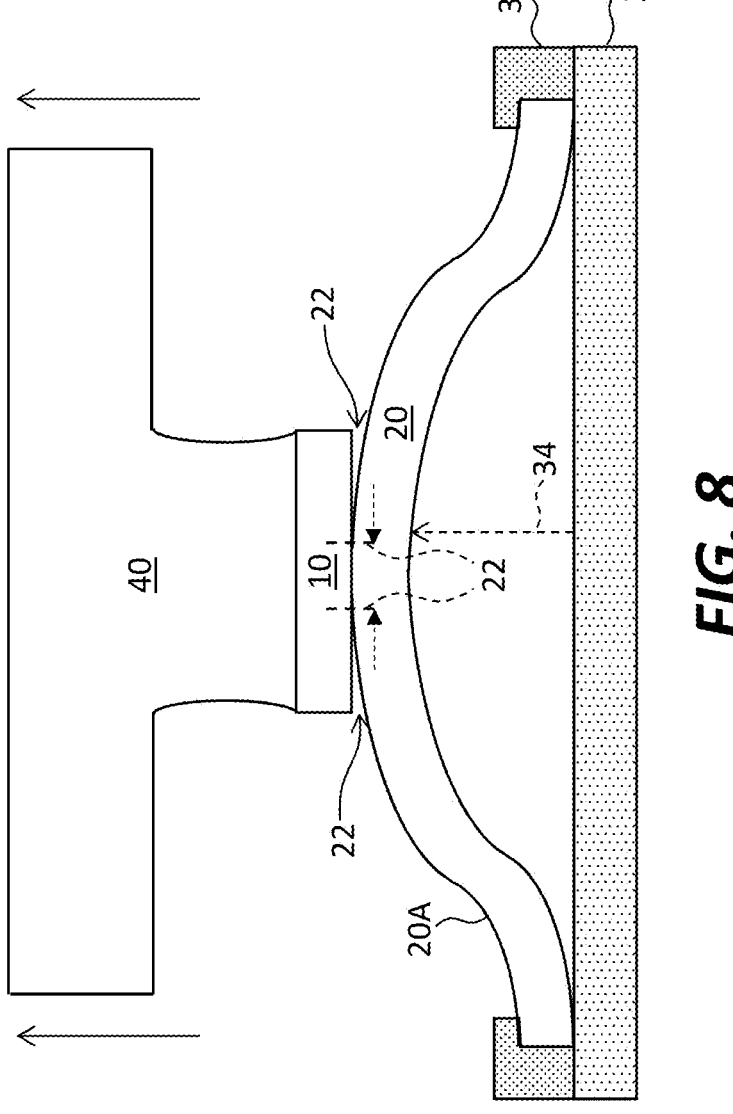
FIG. 8 is a detail cross section of delaminating a component from an adhesive surface on a support substrate using a visco-elastic stamp corresponding to FIG. 7C according to illustrative embodiments of the present disclosure.

FIG. 8 illustrates a detail of FIG. 7C and step 240. Support substrate 32 and tape frame 30 hold tape 20 and adhesive surface 20A in place at the perimeter of tape 20. As stamp 40 pulls component 10 away from adhesive surface 20A and support substrate 32 in step 230, tape 20 is pulled between component 10 and tape frame 30, deforming tape 20 and adhesive surface 20A with a tensile force in step 240. The tensile force in tape 20 is strongest at the corners and edges of component 10 and at tape frame 30. The adhesive surface 20A deformation forms a delamination front 22 (a peel front 22 that is substantially a line or curve where adhesive surface 22 changes from being adhered to component 10 to being released from component 22, indicated with a dashed line) in step 240 that can progress spatially over time from edges or corners of component 10 to a center or more central portion of component bottom side 11 (e.g., a component bottom side 11 of component 10 further from the edge or corner of component 10) adhered to adhesive surface 20A, as shown by the dashed arrows in FIG. 8. The adhesive surface 20A deformation caused by stamp 40 pulling component 10 away from (e.g., with a tensile force that stretches stamp post 42) adhesive surface 20A and support substrate 32 creates a stronger delamination force between the edge or corner of component 10 and deformed adhesive surface 20A than between the center or more central portion of component 10 and deformed adhesive surface 20A. Moreover, the delamination force between the edge or corner of component 10 and deformed adhesive surface 20A can be less than an adhesive force between the whole of component 10 and adhesive surface 20A. Thus, without the deformation of adhesive surface 20A, component 10 is adhered to adhesive surface 20A with a greater adhesive force than is present at the delamination front 22. The reduced local adhesive force at the corners and edges of component 10 due to the deformation of adhesive surface 20A and formation of delamination front 22 can enable a successful removal of component 10 from adhesive surface 20A. The spatially progressive delamination enabled by the deformed adhesive surface 20A effectively reduces the tensile force necessary to overcome adhesion to at least a portion of component 10 at a particular moment in time. Rather than requiring enough force to remove the entirety of a bottom surface of component 10 from adhesive surface 20A at a single moment (instant) in time, the deformation of adhesive surface 20A allows the adhesive surface 20A to be removed a portion at a time, reducing the absolute force needed to separate component 10 from adhesive surface 20A at any particular moment in time. Thus, even where an adhesion of a portion of component 10 to adhesive surface 20A is greater than an adhesion of component 10 to stamp 40, component 10 can still be separated from adhesive surface 20A by stamp 40, for example due to a propagating delamination front that originates at one or more corners, one or more edges, or both one or more corners and one or more edges of component 10 and spatially propagates toward a more central area of component 10. The separation force required at the delamination front can be less than the van der Waals force between component 10 and adhesive surface 20A and can also be less than the force adhering component 10 to adhesive surface 20A over the entire area of component 10 adhered to adhesive surface 20A.

Figure 15:
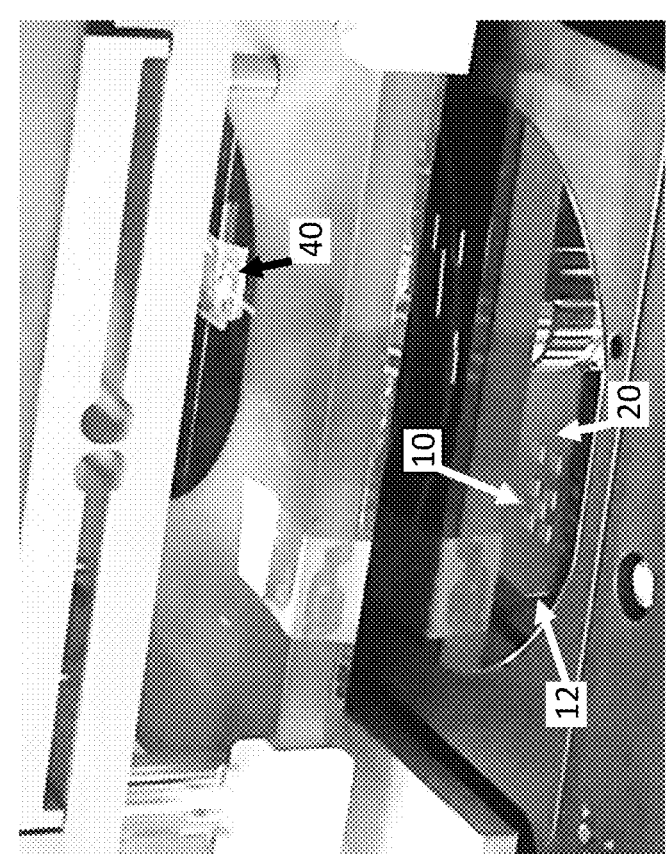
FIG. 15 is an image of a micro-transfer printing system according to illustrative embodiments of the present disclosure.

Embodiments of the present disclosure, which are illustrated and discussed with respect to FIGS. 7A-7I, 8, and 12, have been demonstrated using a commercial micro-transfer printer. A dicing tape 20 with singulated component 10 held by a tape frame 30 was supported by a wafer support substrate 32 and placed over a vacuum chuck provided with the printer. The wafer support substrate 32 was held firmly in place by an applied vacuum (or reduced air pressure), but no vacuum or reduced air pressure (or chemical adhesive) was applied between the wafer support substrate 32 and tape substrate 20S, so that tape 20 was free to move vertically except where held in place by tape frame 30 at a (portion of) perimeter of tape 20, for example as shown in FIG. 7A. Stamp 40 with stamp post 42 made of PDMS contacted component 10 (step 210), removed component 10 from adhesive surface 20A (steps 220-250), transferred component 10 to target substrate 50 (step 400), contacted and adhered component 10 to target substrate 50 (steps 410-420), and removed stamp 40 (step 430), all using the micro-transfer printer. In contrast to this demonstration of embodiments of the present application, attempts to remove component 10 from an adhesive surface 20A wherein the entirety of adhesive surface 20A and tape 20 is held on to support substrate 32 with an air pressure differential (e.g., with a vacuum chuck) failed. This work was done on the commercial micro-transfer printing tool shown in FIG. 15 with tape 20, components 10, component source wafer 12, and stamp 40 indicated. The remainder of the Figure shows the mechanical, optical, and electronic elements of the micro-transfer printing tool.

Figures 9A, 9B:
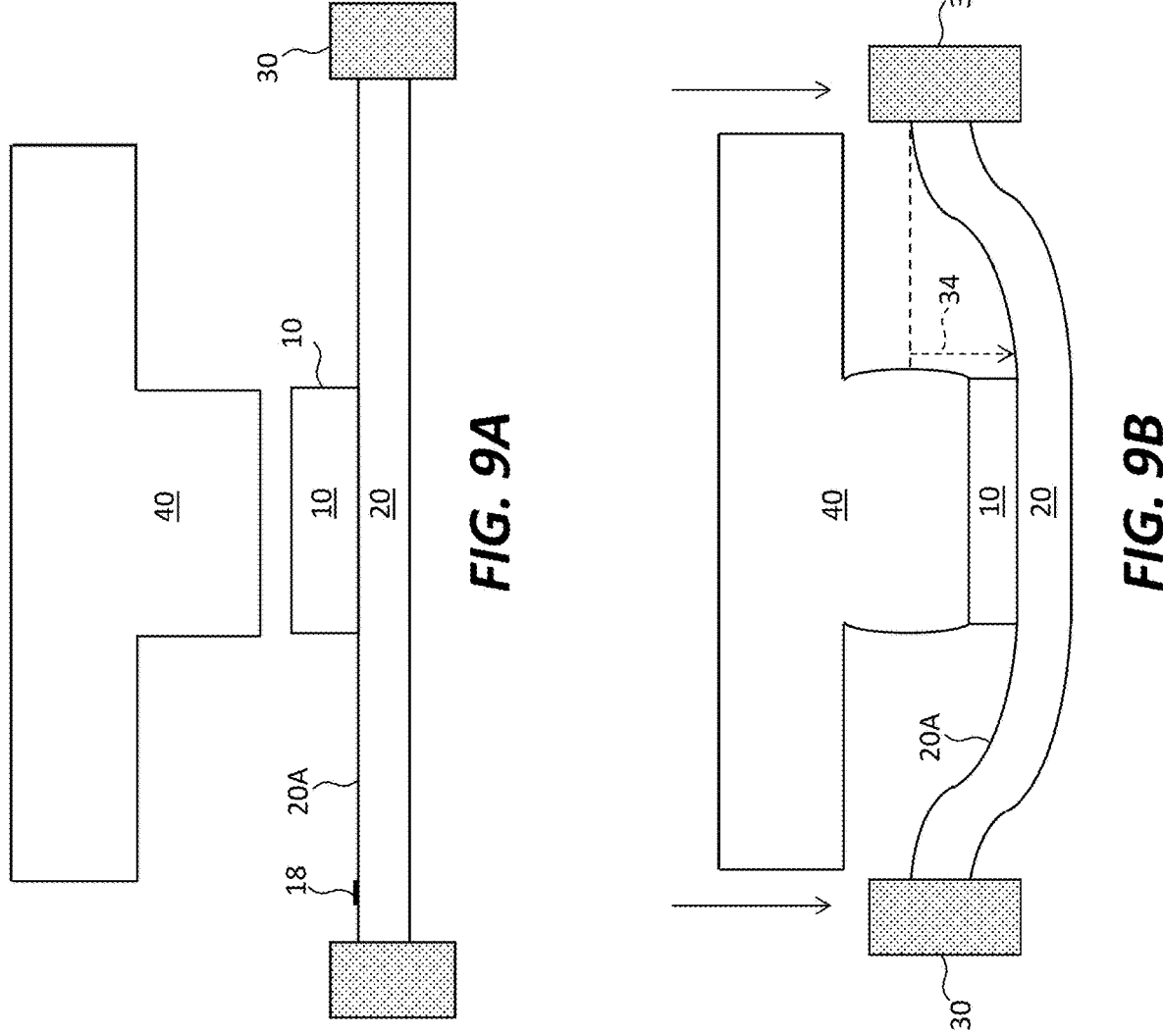
FIGS. 9A-9D are sequential cross sections of structures in a micro-transfer printing process from a suspended adhesive surface using a visco-elastic stamp according to illustrative embodiments of the present disclosure.
Figure 9C:
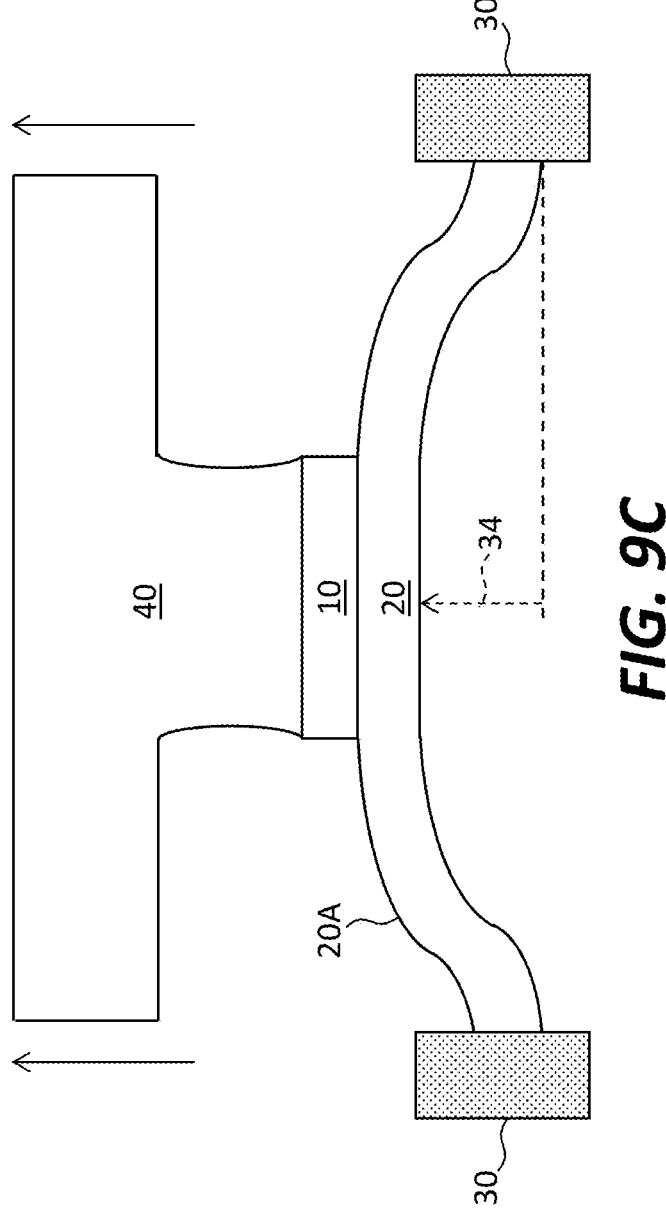
Figure 9D:
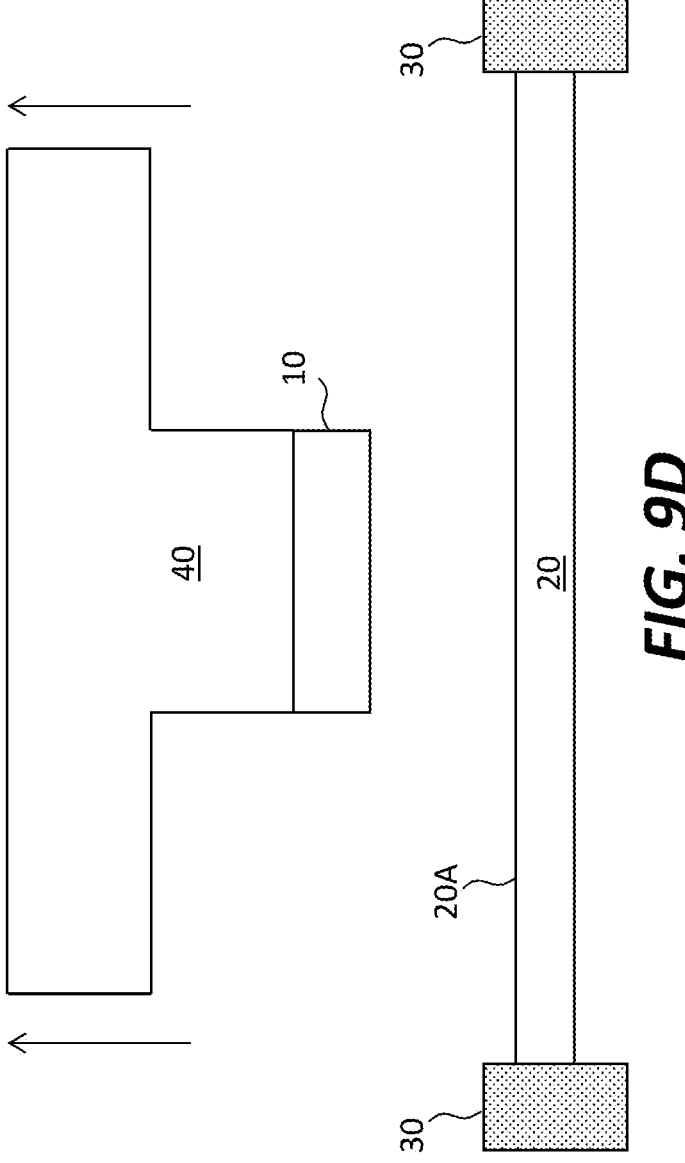
Figure 10:
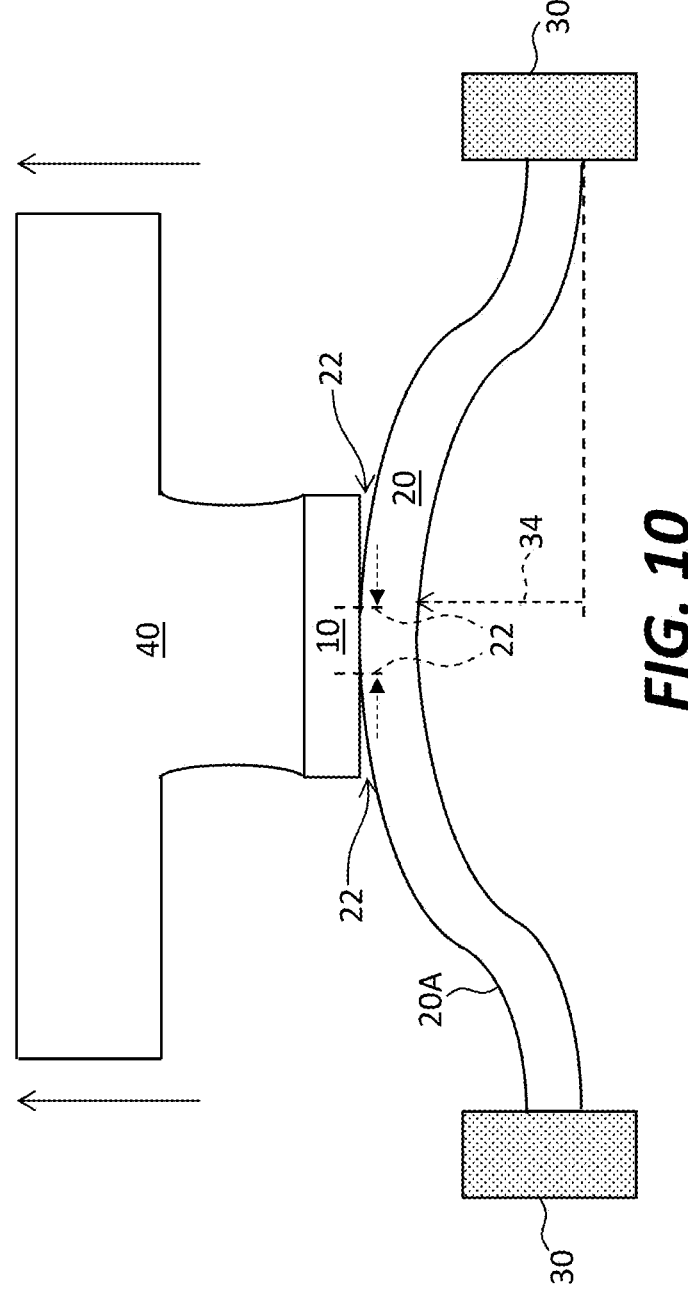
FIG. 10 is a detail cross section of delaminating a component from a suspended adhesive surface using a visco-elastic stamp corresponding to FIG. 9C according to illustrative embodiments of the present disclosure.
Figure 14:
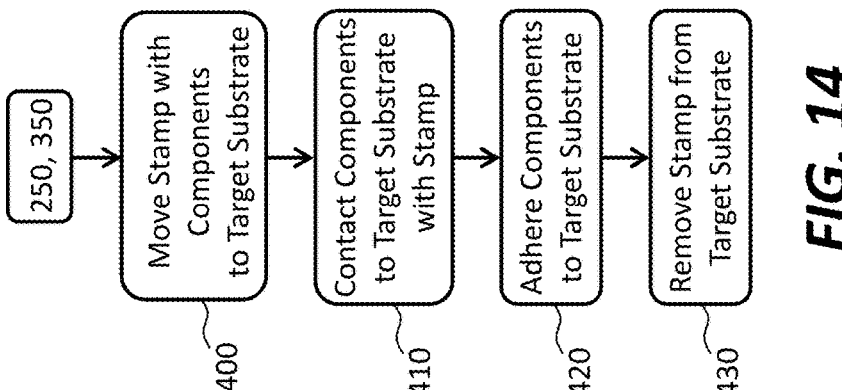
FIG. 14 is a flow diagram describing micro-transfer printing a component from a suspended adhesive surface with a visco-elastic stamp according to illustrative embodiments of the present disclosure.

In some embodiments, component 10 is disposed on an at least partly suspended adhesive surface 20A so that at least a portion of adhesive surface 20A is suspended, for example as shown in FIGS. 3A, 3B. As shown in FIGS. 9A-9D and described with respect to the FIG. 13 flow diagram, adhesive surface 20A with component 10 is supported by tape frame 30, e.g., by a circular hoop or rectangular frame that supports tape 20 and adhesive surface 20A around at least a portion of a perimeter of tape 20. Tape 20 is provided without a supporting substrate 32 disposed beneath and in contact with a side of tape 20 opposite adhesive surface 20A and component 10, as shown in FIG. 9A with stamp 40 and in step 300. (Tape 20 can also be suspended and adhered to a top or bottom of tape frame 30, for example if it is "double-sided" tape 20.) In some embodiments, tape 20 is clamped by tape frame 30, for example as illustrated in FIG. 2B. Component 10 is contacted by a distal end of stamp post 42 in step 310 and as in FIG. 7B and step 210 by moving stamp 40 downwards toward component 10 and tape 20 but, because adhesive surface 20A is suspended by tape frame 30 and is not supported by a support substrate 32, adhesive surface 20A and tape substrate 20S of tape 20 is deformed downwards in a direction away from stamp 40 in step 320 and as shown in FIG. 9B. Stamp 40 is then moved in the opposite direction, upwards away from tape 20, pulling component 10 in step 330 and deforming adhesive surface 20A and tape 20, as shown in FIG. 9C in step 340. As shown in FIG. 9D, component 10 can be entirely removed from tape 20 and tape 20 can return to its original shape in step 350. Because tape 20 can be elastic, the acceleration of stamp 40 away from tape 20 and the elastic restoration of the position or shape of tape 20 during the upward movement of stamp 40 provide additional acceleration to component 10 and additional delamination force between component 10 and adhesive surface 20A, enhancing the removal of component 10 from adhesive surface 20A. The micro-transfer printer can then print component 10 onto target substrate 50 as described with respect to FIGS. 7E-7I. FIG. 10 is a detail showing component 10 removal from adhesive surface 20A supported by tape frame 30 with delamination fronts 22 corresponding to FIG. 8.

Methods as described with respect to FIGS. 12 and 13 can be repeated so that a first component 10 is first removed from adhesive surface 20A at a first time and a second component 10 is second removed from adhesive surface 20A at a second time later than the first time. In some embodiments, stamp 40 and stamp posts 42 remove multiple components 10 from adhesive surface 20A at a same time.

The movement, acceleration, direction, and distance of stamp 40 as well as tape 20 material (thickness, flexibility) and stamp post 42 material (flexibility, softness, stamp post 42 height) can be co-optimized to provide a highly reliable, consistent, and high-yield removal of components 10 from tape 20 suitable for very small or fragile components 10 without the use of vacuum pick-and-place tools 16.

Components 10 can have a size or extent over adhesive surface 20A that is much smaller than the size or extent of adhesive surface 20A. For example, components 10 can have a length or width substantially parallel to adhesive surface 20A of no greater than 200 microns (e.g., no greater than 100 microns, no greater than 250 microns, no greater than 20 microns, no greater than 10 microns, or no greater than 5 microns). In contrast, adhesive surface 20A can have a diameter (e.g., similar to a component source wafer 12 diameter) of 300 mm, 200 mm, 150 mm, or 100 mm. Thus, the ratio of sizes in a dimension can be a factor of approximately one hundred thousand (e.g., a 3-micron long component 10 compared to a 300 mm adhesive surface 20A diameter corresponding to a 300 mm component source wafer 12). Components 10 can be fragile and have a thin substrate, for example having a thickness no greater than fifty microns (e.g., no greater than twenty microns, no greater than ten microns, no greater than five microns, no greater than one micron, or no greater than 500 nm).

Figure 16:
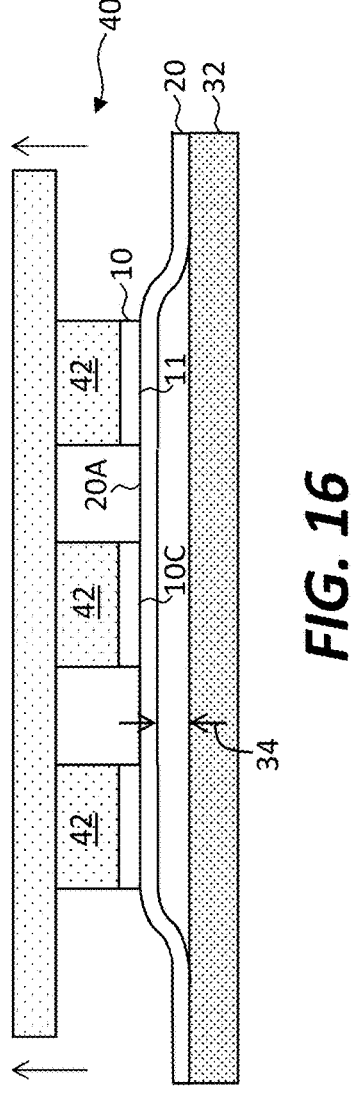
FIG. 16 is a cross section of structures for micro-transfer printing multiple components from a tape with an adhesive surface using a visco-elastic stamp with multiple posts according to illustrative embodiments of the present disclosure.

In some embodiments of the present disclosure, multiple components 10 can be disposed on a single adhesive surface 20A and stamp 40 can comprise corresponding multiple stamp posts 42 having spatial locations matched to the spatial locations of the multiple components 10 on the single adhesive surface 20A. The arrangement of components 10 on adhesive surface 20A can be one dimensional or two dimensional. The cross section of FIG. 16 illustrates a linear arrangement of three components 10 on adhesive surface 20A of tape 20 with center component 10C disposed linearly between two components 10. When stamp 40 pulls components 10, 10C away from support substrate 32 to form gap 34 between tape 20 and support substrate 32, the delamination force between corners and edges of component bottom sides 11 of components 10 can be greater for the corners and edges of components 10 closer to the edge of adhesive substrate 10 than for those center components 10C in the array of components 10 disposed on adhesive surface 20A between components 10. In some embodiments, a slower pulling away acceleration can delaminate adhesive surface 20A first from components 10 closer to the edge of adhesive substrate 10 and then subsequently from center components 10C. However, a slower acceleration can reduce the adhesion between distal end of stamp post 42 with rate-dependent adhesion and component 10, making removing component 10 from adhesive surface 20A more difficult.

Figure 17A:
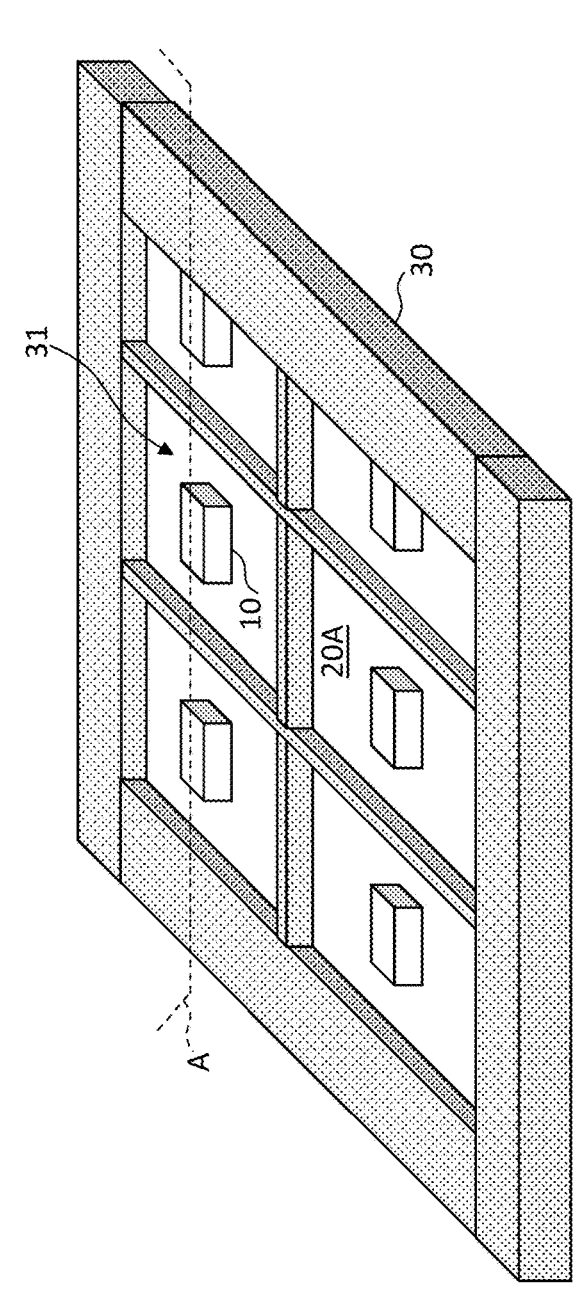
FIG. 17A is a perspective of a tape frame dividing a suspended adhesive surface into multiple lattice openings, a component disposed on the suspended adhesive surface in each lattice opening, and a stamp with multiple stamp posts according to illustrative embodiments of the present disclosure.
Figure 17B:
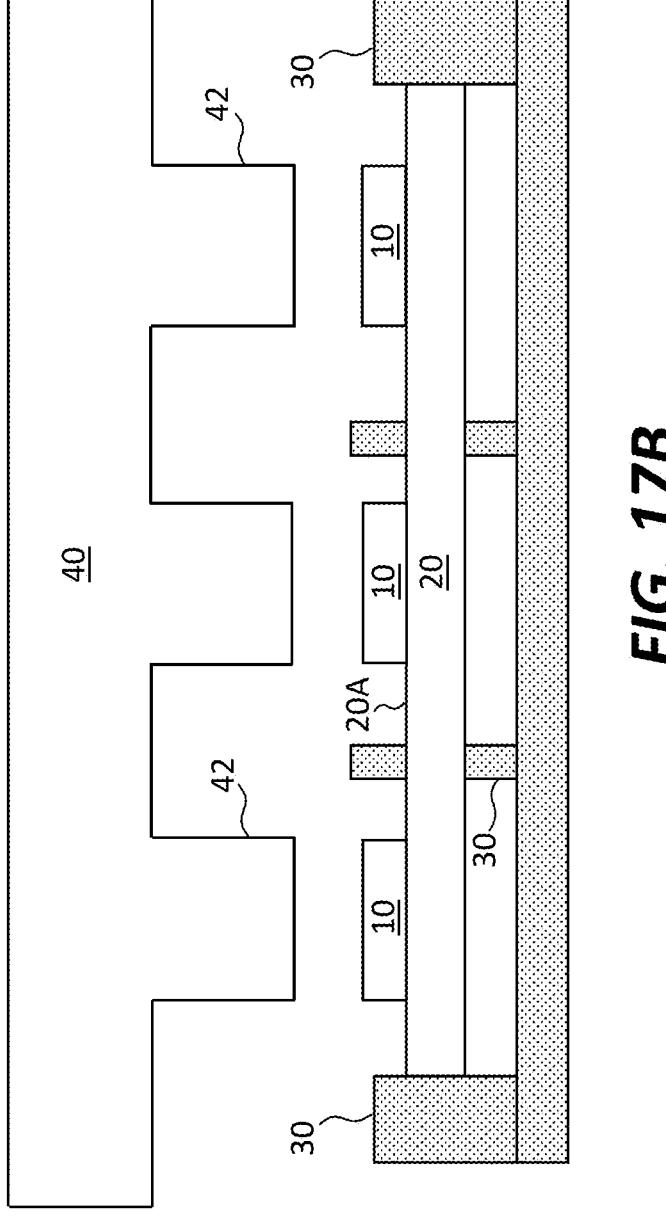
FIG. 17B is a cross section taken across cross section line A of FIG. 17A according to illustrative embodiments of the present disclosure.

According to some embodiments of the present disclosure, arrays of components 10 can be removed from adhesive surface 20A with an additional structure that holds adhesive surface 20A in place between each component 10 or between groups (subsets that are less than all) of components 10 disposed on adhesive surface 20A. According to some embodiments of the present disclosure, the additional structure can be a part of support substrate 32, a part of tape frame 30, or a part of stamp 40, or a combination of these. FIGS. 17A and 17B illustrate multiple components 10 on adhesive surface 20A of tape 20 suspended with a tape frame 30 including a support disposed between the two components 10 that suspends adhesive surface 20A and components 10 between tape frame 30 supports. Tape frame 30 can comprise portions that support tape 20 around a perimeter and also portions that extend across tape 20 and above and below tape 20, for example forming a crisscross lattice pattern with lattice openings 31. Components 10 are disposed on tape 20 within lattice openings 31 (e.g., holes) in the lattice pattern between portions of tape frame 30, as shown in the perspective of FIG. 17A and corresponding cross section of FIG. 17B. Note that the crisscross lattice structures of tape frame 30 can be disposed both above and below tape 20 so that components 10 and adhesive surface 20A are suspended within each of lattice openings 31. More than one component 10 can be disposed within a single lattice opening 31, for example a 2×2 array of components 10 can be so disposed.

Figure 18A:
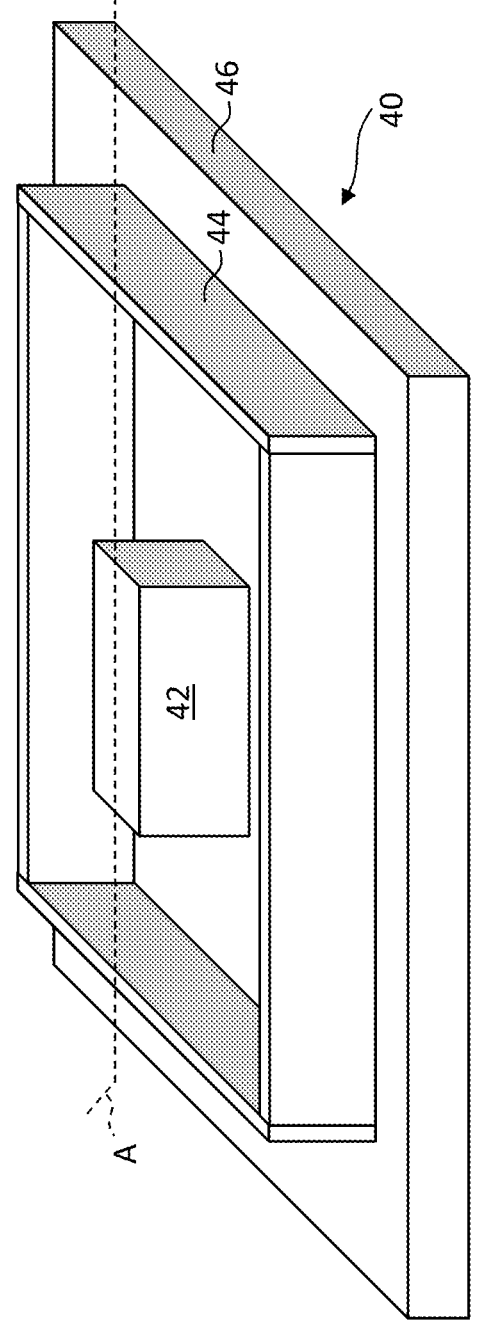
FIG. 18A is a perspective of a stamp comprising a post frame and stamp post according to illustrative embodiments of the present disclosure.
Figure 18B:
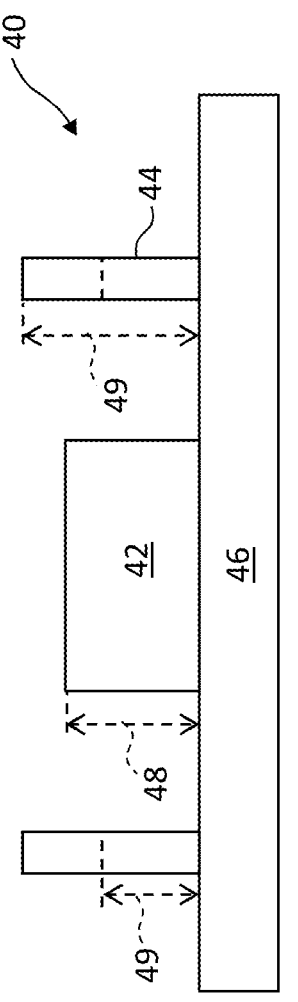
FIG. 18B is a cross section taken across cross section line A of FIG. 18A according to illustrative embodiments of the present disclosure.

In some embodiments and as illustrated in FIG. 18A, the additional structures providing support to tape 20 can be provided by stamp 40. A post frame 44 can at least partially surround each stamp post 42 (or group of stamp posts 42 less than all of stamp posts 42) (around its/their perimeter(s)). The post frame(s) 44 serve as a standoff for stamp posts 42 so that, when stamp 40 moves downward towards tape 20 to adhere the distal end of stamp post 42 to component 10, post frame 44 pushes against adhesive surface 20A between components 10, increasing the delamination force between adhesive surface 20A and component 10, thereby facilitating component 10 release from adhesive surface 20A.

Figures 19A, 19B:
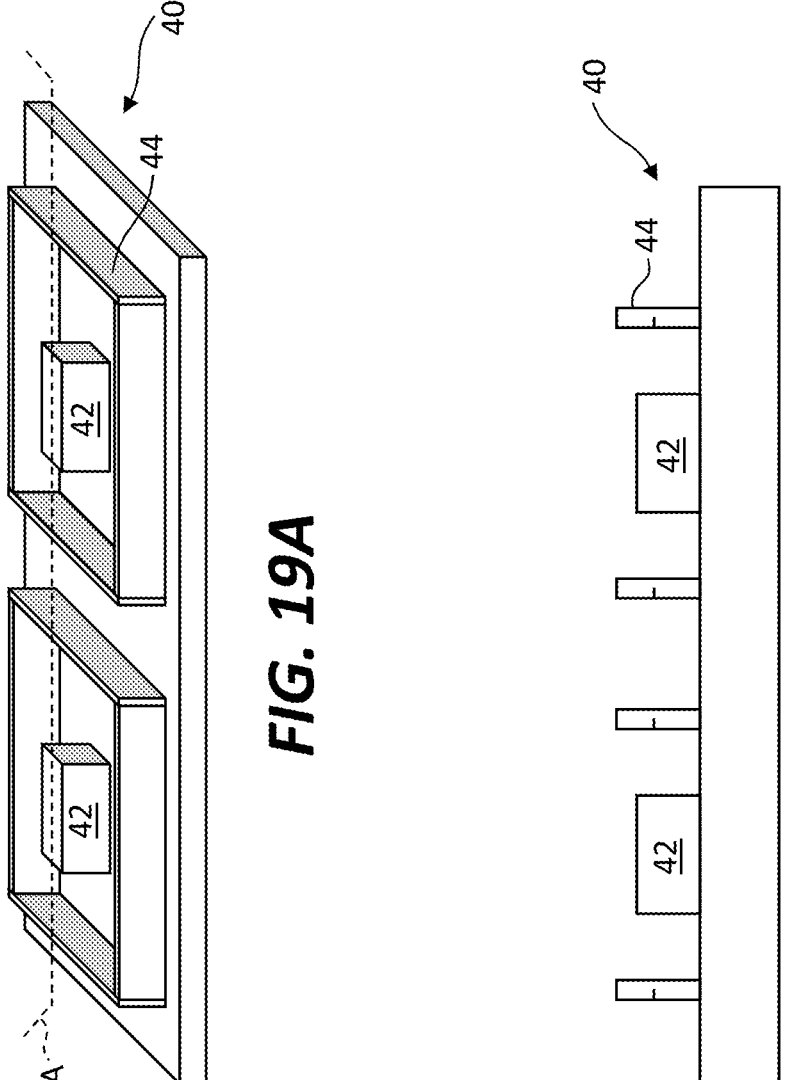
FIG. 19A is a perspective of a stamp comprising multiple separated post frames and stamp posts according to illustrative embodiments of the present disclosure.
FIG. 19B is a cross section taken across cross section line A of FIG. 19A according to illustrative embodiments of the present disclosure.
Figure 20A:
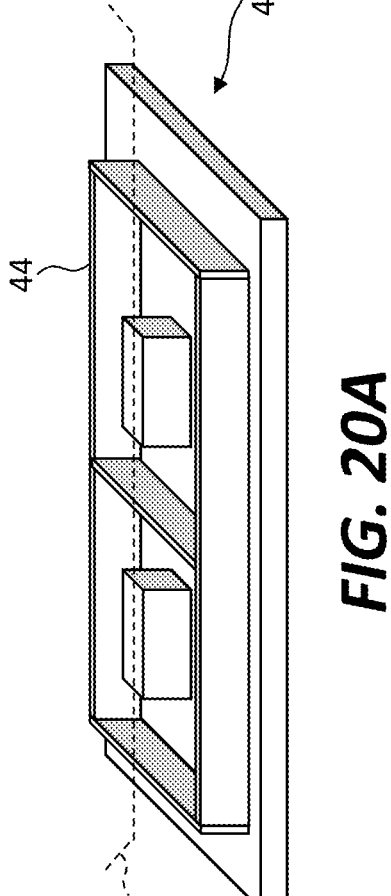
FIG. 20A is a perspective of a stamp comprising multiple post frames with shared frame structures and stamp posts according to illustrative embodiments of the present disclosure.
Figure 20B:
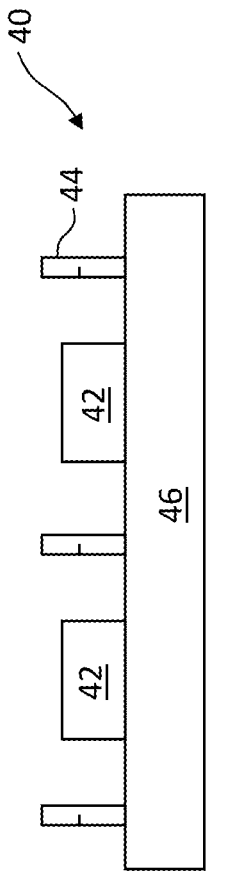
FIG. 20B is a cross section taken across cross section line A of FIG. 20A according to illustrative embodiments of the present disclosure.
Figure 21:
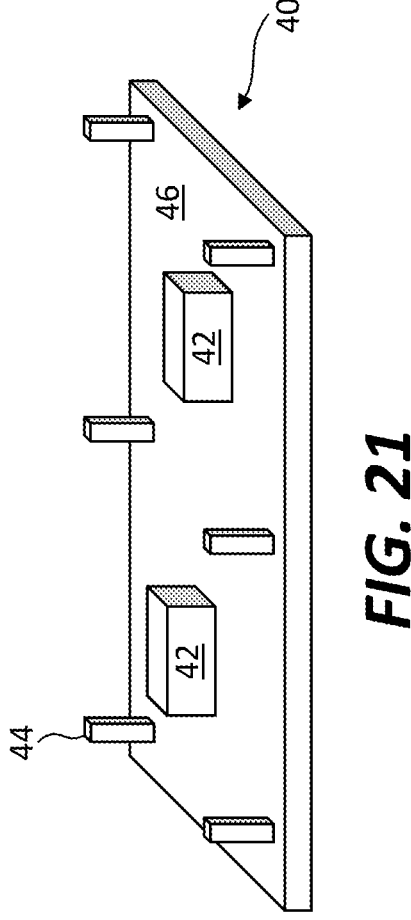
FIG. 21 is a perspective of a stamp with stamp posts and separated post frames according to illustrative embodiments of the present disclosure.
Figures 22A, 22B, 22C:
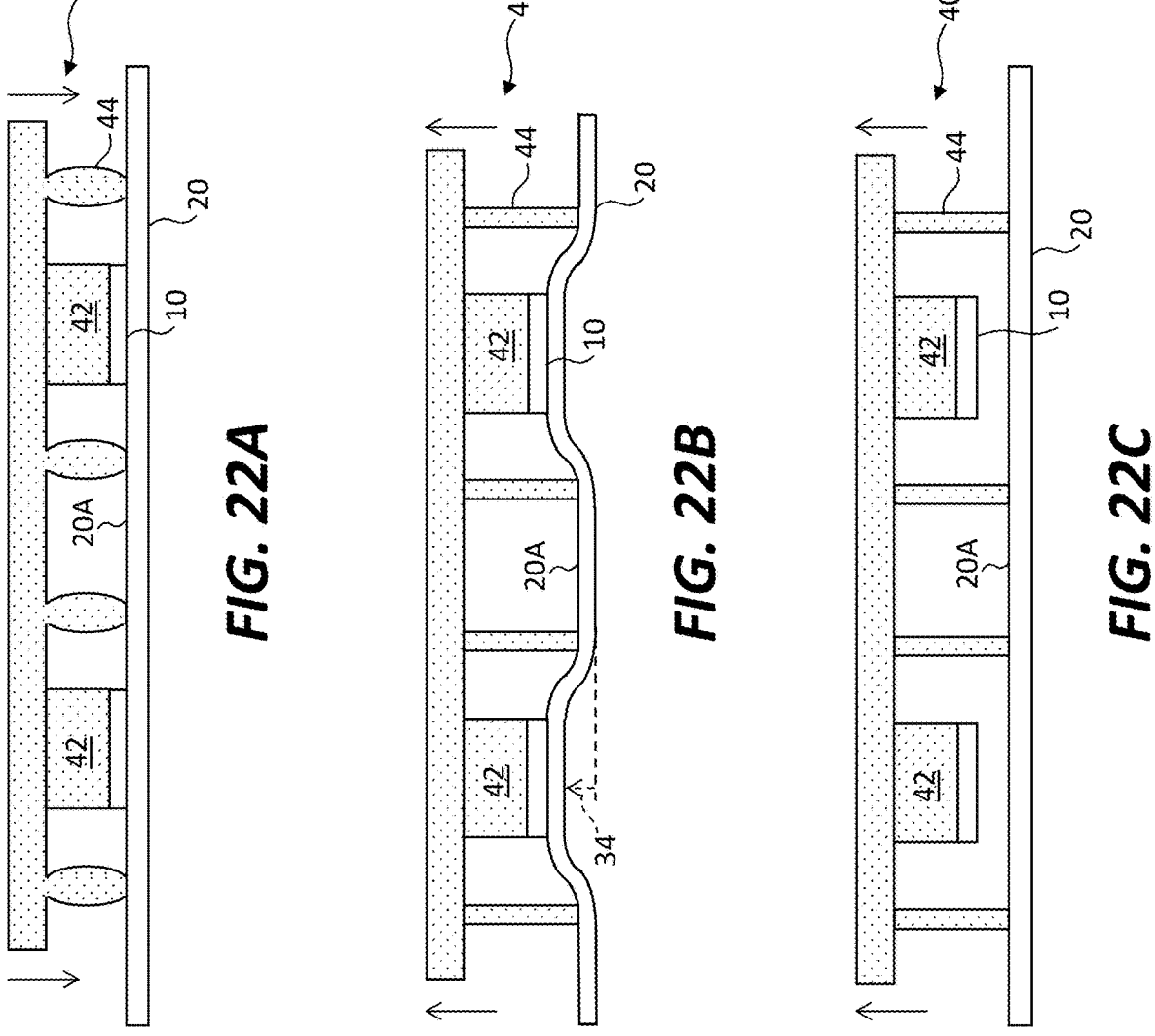
FIGS. 22A-22C are sequential cross sections of structures for micro-transfer printing components from an adhesive surface using a visco-elastic stamp with multiple post frames and stamp posts according to illustrative embodiments of the present disclosure.

FIGS. 19A, 19B, 20A, 20B, and 21 illustrate stamps 40 with multiple stamp posts 42. Each stamp post 42 can be at least partially (e.g., entirely) surrounded around its perimeter by an individual and separate post frame 44 (e.g., as shown in FIGS. 19A, 19B) or by a post frame 44 that shares one or more portions with another post frame 44 (e.g., as shown in FIG. 20A, 20B). Post frames 44 can completely surround a perimeter of stamp posts 42 (e.g., as shown in FIGS. 18A-20B) or can only partially surround a perimeter of stamp posts 42 (for example if only two or three of the four sides of post frame 44 in FIGS. 18A-18B were present or as shown in FIG. 21). For example, post frame 44 can comprise one or more standoff posts disposed around stamp post 42, as shown in FIG. 21. Many or few standoff posts comprising post frame 44 disposed around stamp posts 42 can be used. In some embodiments, adhesive surface 20A is patterned so that adhesive surface 20A does not adhere to post frames 44. Post frame 44 can extend a frame distance 49 (labeled in FIG. 18B) that is less than (FIG. 18B), equal to, or greater than (FIGS. 19B, 20B) a post distance 48 that stamp post 42 extends from stamp bulk layer 46 (also labeled in FIG. 18B). Post frame 44 can be disposed closer to or farther from stamp post 42 on stamp bulk layer 46, for example depending on the size of components 10, the material attributes of stamp 40, and the movement of stamp 40 with respect to adhesive surface 20A and component 10. Each post frame 44 can be separated from any stamp post 42 by a distance (e.g., as shown in FIGS. 18A-21). FIGS. 22A-22C illustrate the operation of stamp 40 with post frames 44 that extend beyond posts 42. As shown in FIG. 22A with longer post frames 44 than stamp posts 42, stamp posts 42 contact component 10, compressing post frame 44 and pressing post frame 44 against adhesive surface 20A, pushing adhesive surface 20A with a force in a direction away from component 10, as shown in FIG. 22B. Components 10 then locally delaminate from adhesive surface 20A within lattice openings 31. The additional and relatively local force provided by post frame 44 can assist in the delamination, as described above with respect to FIG. 10. Notably here, as with other embodiments previously described, it is desirable for tape 20 to flex, bend, or otherwise at least partially elastically deform when subjected to less tensile force than the adhesive force(s) adhering components 10 to stamp posts 42, otherwise components 10 could simply fall off of stamp posts 42 instead of being removed from tape 20. In some embodiments, stamp posts 42 can be selectively irradiated (e.g., one at a time or multiple (e.g., all) at a time) in order to print component(s) 10 from stamp post(s) 42 to a target substrate 50. Examples of such methods are described in U.S. Pat. No. 10,573,544, which is incorporated by reference herein. In some embodiments, components 10 are printed to a patterned adhesive layer on target substrate 50 such that, during printing, components 10 contact patterned adhesive but stamp frames 44 do not, thereby adhering components 10 to target substrate 50 (through patterned adhesive) without applying potentially damaging amounts of force to stamp frames 44. In some embodiments, no such selective irradiation or patterned adhesive is used.

Figures 23A, 23B, 23C:
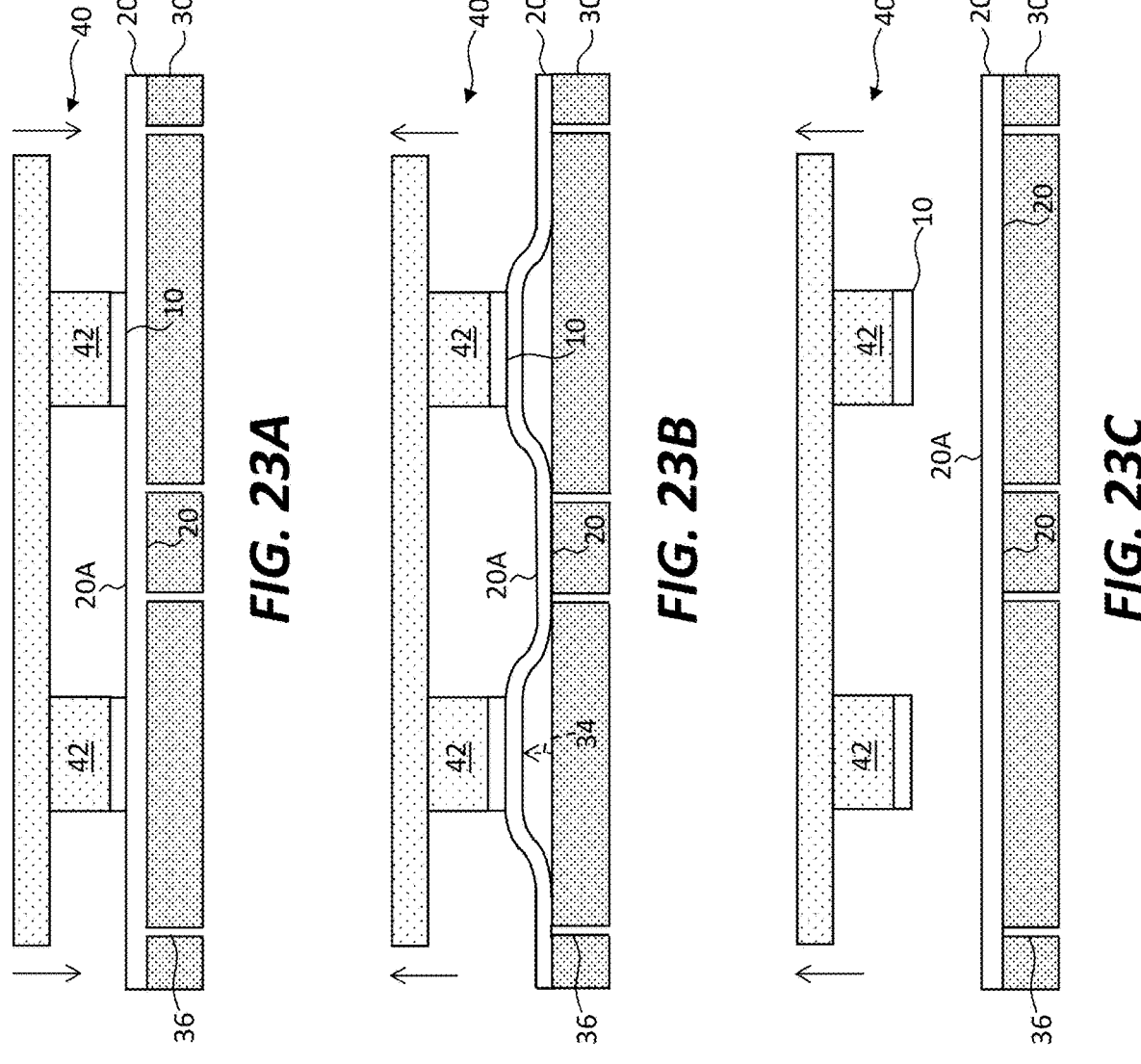
FIGS. 23A-23C are sequential cross sections of structures for micro-transfer printing components from an adhesive surface on a support substrate with patterned vacuum holes using a visco-elastic stamp with multiple posts according to illustrative embodiments of the present disclosure.

In some embodiments and as illustrated in FIGS. 23A-23C, a patterned adhesive force can be applied to tape 20 using support substrate 32, for example with a pattern of vacuum holes 36 through which a vacuum (or pressure differential) against only a portion of adhesive surface 20A can be provided in support substrate 32, for example only laterally between components 10 on tape 20. A pressure differential can be applied by a vacuum pump to vacuum holes 36 that provide the patterned adhesion between tape 20 and support substrate 32. As stamp posts 42 pull components 10 upwards and away from support substrate 32, vacuum applied through patterned vacuum holes 36 disposed between components 10 holds tape 20 against support substrate 32 laterally between components 10 (but not directly under components 10), increasing the delamination force provided between adhesive surface 20A and the edges and corners of components 10, improving the release of components 10 from adhesive surface 20A as described above with respect to FIG. 8.

Figure 24A:
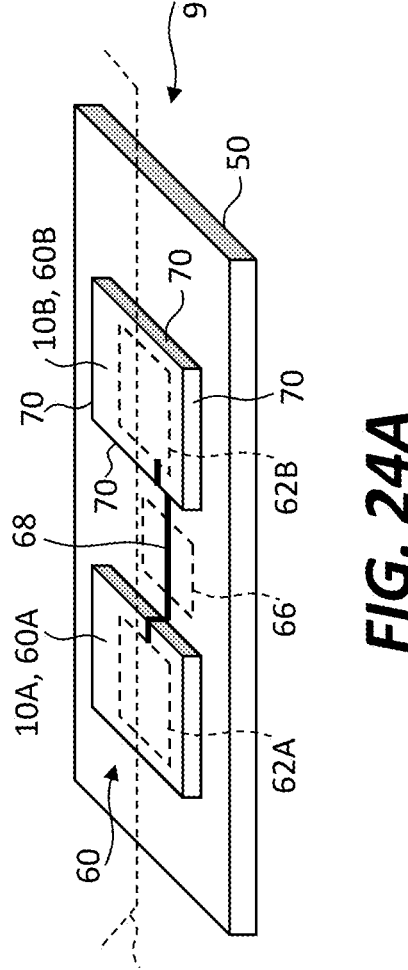
FIG. 24A is a perspective of first and second epitaxy structures disposed on a substrate and FIG. 24B is a cross section of FIG. 24A taken across cross section line A with a corresponding plan view detail of the first epitaxy structure according to illustrative embodiments of the present disclosure.
Figure 24B:
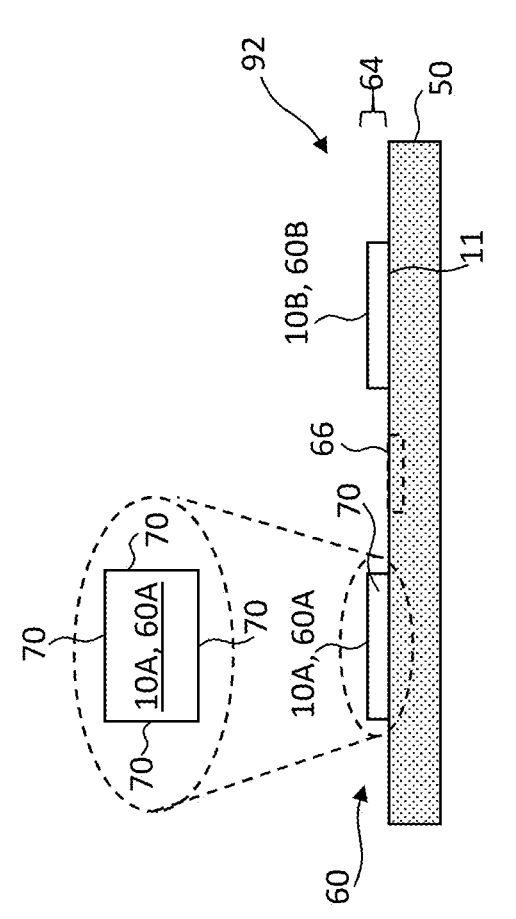

Methods of the present disclosure can enable novel and useful multi-epitaxy or multi-component structures 92 that are not readily constructed using certain previously available systems and methods. As shown in FIGS. 24A and 24B, multi-epitaxy structures 92 can comprise relatively thin epitaxy structures 60 made in an epitaxial material having a relatively large area, for example having a thickness from two μm to fifty μm and having areas from tens of square microns to tens of square millimeters disposed on a substrate 50. Epitaxy structures 60 can comprise components 10 (e.g., one component 10 in each epitaxy structure 60). Epitaxy structures 60 can have a cleaved perimeter 70. Epitaxy structures 60 can be unprocessed portions of an epitaxial layer, e.g., as deposited on a source wafer using chemical vapor deposition. Components 10 can be made in an epitaxial material or epitaxy structure 60 (such that epitaxy structure 60 comprises a component 10) using photolithographic processes. Components 10 can be integrated circuits.

In some embodiments and as illustrated in the perspective of FIG. 24A and corresponding cross section of FIG. 24B taken along cross section line A of FIG. 24A, a multi-epitaxy structure 92 comprises a substrate 50 (for example a target substrate 50) and first and second epitaxy structures 60A, 60B (each an epitaxy structure 60 and together epitaxy structures 60) disposed on substrate 50. Multi-epitaxy structure 92 can be or comprise a multi-component structure 92, where components 10 are processed functional epitaxy structures 60, for example photolithographically processed epitaxy structures 60 each comprising a component 10 (as shown). Multi-epitaxy structures 92 can comprise more than two relatively thin epitaxy structures 60 made of different crystalline materials, having cleaved perimeters 70, and various areas, for example three, four, five, or ten epitaxy structures 60 on substrate 50.

First epitaxy structure 60A can comprise a first crystalline material disposed on substrate 50. In some embodiments, first epitaxy structure 60A has a cleaved perimeter 70 and a first thickness no greater than fifty microns thick (e.g., no greater than forty microns thick, no greater than thirty microns thick, no greater than twenty microns thick, no greater than ten microns thick, no greater than five microns thick, or no greater than two microns thick). Similarly, second epitaxy structure 60B can comprise a second crystalline material different from the first crystalline material and be disposed on substrate 50. In some embodiments, second epitaxy structure 60B has a cleaved perimeter 70 and a second thickness no greater than fifty microns thick (e.g., no greater than forty microns thick, no greater than thirty microns thick, no greater than twenty microns thick, no greater than ten microns thick, no greater than five microns thick, or no greater than two microns thick). First epitaxy structure 60A and second epitaxy structure 60B are disposed at least partly (e.g., substantially) in a common layer 64 over substrate 50, for example within manufacturing tolerances, and can be disposed directly on, in contact with, and adhered to substrate 50 or indirectly on (over) and adhered to substrate 50, for example with an intervening layer between epitaxy structures 60 and substrate 50, such as an adhesive layer.

In some embodiments, each of first and second epitaxy structures 60A, 60B has a cleaved perimeter 70. A cleaved perimeter 70 comprises cleaved edges 70, cleaved edge faces 70, cleaved sides 70, or a combination thereof, that extend around the perimeter of epitaxy structures 60, that is around all of the edges of epitaxy structures 60. A cleaved edge 70 can be a face (e.g., an edge face) or side of epitaxy structure 60 that extends in a direction at an angle (e.g., orthogonally) to a surface (e.g., a process surface) of epitaxy structure 60 or a surface of substrate 50 on (e.g., over) which epitaxy structures 60 are disposed. Thus, cleaved perimeter 70 can be a cleaved side 70 or cleaved edge face 70 of epitaxy structure 60 that is not the process side or opposing back or bottom side 11 of epitaxy structure 60. A process side of epitaxy structure 60 can be a side in or on which structures are photolithographically constructed to make a native component 10 in or on epitaxy structure 60 and an opposing back or bottom side 11 can be a side adhered to substrate 50.

Cleaved perimeter 70 can be made by dicing an epitaxy source wafer 12 having epitaxy structures 60 or to form epitaxy structures 60. Each cleaved edge 70 can be made by cutting or separating each edge of epitaxy structure 60 from epitaxy source wafer 12 or other epitaxy structures 60 of epitaxy source wafer 12. Cleaved edge 70 can be a scribed edge (e.g., an edge cut with a knife or other sharp tool), a cracked edge (e.g., an edge formed by making a scribe line and cracking epitaxy structure 60 along the scribed line), a melted or vaporized edge (e.g., a laser cut edge formed by melting or vaporizing epitaxy structure 60 along a line using a laser), or a sawn edge (for example cut using a diamond-tipped dicing saw). According to some embodiments of the present disclosure, cleaved perimeter 70, cleaved edge 70, or cleaved edge faces 70 can be mechanically or optically formed rather than chemically formed by etching with a chemical etchant.

Each or both of first epitaxy structure 60A and second epitaxy structure 60B can comprise (e.g., be) a photolithographically processed component 10 (e.g., a first component 10A and a second component 10B, respectively), for example an unpackaged, bare die semiconductor integrated circuit. In some embodiments, first and second epitaxy structures 60A, 60B comprise unprocessed epitaxial crystalline semiconductor materials, comprise doped epitaxial crystalline semiconductor materials, or comprise implanted materials useful in integrated circuits. For example, the semiconductor can be silicon or can be a compound semiconductor, such as GaAs, Gan, InGaN, or InP, or other semiconductors. First epitaxy structure 60A can be a single crystalline structure (comprising a single crystal), second epitaxy structure 60B can be a single crystalline structure (comprising a single crystal), or both first and second epitaxy structures 60A, 60B can be single crystalline structures (each comprising a single crystal).

Substrate 50 can comprise an amorphous material or crystalline material (e.g., polycrystalline material) and can be rigid or flexible. Substrate 50 can be a semiconductor substrate 50, for example a silicon or compound semiconductor substrate 50. Substrate 50 can comprise a native substrate circuit 66 and either or both of first epitaxy structure 60A and second epitaxy structure 60B can comprise a native first circuit 62A or native second circuit 62B formed in or on first epitaxy structure 60A or second epitaxy structure 60B, respectively. Substrate circuit 66 can be electrically (or optically, or both electrically and optically) connected to either or both of first and second circuits 62A, 62B, for example with interconnects 68 (e.g., wires or light pipes/light guides, or both) disposed at least partly on a surface of substrate 50 and first and second epitaxy structures 60A, 60B, for example thin-film electrical interconnects 68 (e.g., metal wires) or a substantially transparent thin-film optical interconnect 68 (e.g., one or more light pipes, such as one(s) comprising patterned SiN). Similarly, first and second circuits 62A, 62B can be electrically (or optically, or both electrically and optically) connected together with one or more interconnects 68, for example with one or more wires or one or more light pipes disposed at least partly on a surface of substrate 50. In some embodiments, substrate 50 comprises an amorphous material, such as glass, or a polymer material, such as plastic. Substrate circuit 66 can be disposed on substrate 50, for example as a native thin-film circuit formed in an epitaxial semiconductor layer disposed on substrate 50. In some embodiments, substrate circuit 66 is non-native to substrate 50 and can be, for example, disposed by micro-transfer printing substrate circuit 66 on substrate 50 and electrically connected to either or both of native first and second circuits 62A, 62B with one or more interconnects 68.

According to some embodiments of the present disclosure, epitaxy structures 60 are substantially planar and have a length and width (e.g., an area) over substrate 50 that is much larger than a thickness, for example having a length or width (or both) that is no less than five times, ten times, twenty times, fifty times, one hundred times, two hundred times, five hundred times, or one thousand times the thickness of epitaxy structure 60. For example, epitaxy structures 60 can have a thickness of two to fifty microns and a length or width (or both) of one hundred microns to 10 millimeters. Both first and second epitaxy structures 60A and 60B can be disposed on a common surface of substrate 50 (e.g., a process side of substrate 50) at least partly in common layer 64 so that first and second epitaxy structures 60A and 60B have a combined area that is less than or equal to an area of substrate 50.

According to some embodiments of the present disclosure, either or both of first and second epitaxy structures 60A and 60B are continuous and do not have a hole extending through first or second epitaxy structures 60A, 60B. Thus, first and second epitaxy structures 60A and 60B can be hole-free, comprising all points on any line connecting any two points on or within a perimeter of epitaxy structure 60. A hole-free structure increases the amount of epitaxy available for circuits and simplifies circuit layout in a circuit formed in epitaxy structure 60 as well as providing mechanical strength and structural integrity. Hole-free structures can also be easier to construct than similar structures with holes.

Epitaxy structures 60 of the present disclosure can be relatively large and planar compared to their thickness. Conventional means of assembling very thin components (devices) are limited in their scope. For example, wafer bonding and back grinding can effectively (and expensively and slowly) join two wafers together so that first thin epitaxial material from a first wafer of a first material can be disposed upside-down on a substrate and processed. However, further epitaxial materials, including different materials from other second wafers cannot be subsequently disposed on the substrate in a co-planar structure with the first component because the substrate is no longer planar and the presence of the first epitaxial materials can inhibit or prevent the co-planar integration of the second epitaxial materials. Micro-assembly using pick-and-place tools with vacuum chucks cannot reliably assemble materials that are very thin, for example less than one hundred microns thick, no greater than fifty microns thick, no greater than twenty microns thick, no greater than ten microns thick, no greater than five microns thick, or no greater than two microns thick. Vacuum-chuck pick-and-place tools readily crack components with such thin substrates. Micro-transfer printing excels at micro-assembly of small and thin devices, but can have difficulty releasing larger devices with a greater area and a lower aspect ratio of length to width from a device source wafer (where length is the longest dimension and width is a shorter dimension of epitaxy structure 60 orthogonal to the length taken in a horizontal direction parallel to a surface of substrate 50 on which epitaxy structure 60 is disposed), for example having an aspect ratio no greater than five, two, or 1.5 and a length or width (or both) no less than two hundred microns, five hundred microns, one millimeter, two millimeters, or five millimeters. When releasing such large and relatively square components, the release etch can take a relatively long time (e.g., hours) and can therefore attack the component or tethers holding the component in place, potentially destroying them before a sufficiently complete undercut is achieved. Therefore, embodiments of the present disclosure provide relatively thin epitaxy structures 60 comprising different materials with a relatively large area and small aspect ratios assembled on a common substrate 50. Such thin epitaxy structures 60 can be less expensive to construct using less material in shorter periods of time and can provide a denser and thinner assembly. Embodiments comprising different materials can provide different functionalities in a common multi-epitaxy structure 92, for example two different epitaxial structures 60 comprising GaAs and GaN disposed on a silicon substrate 50. In some embodiments, first epitaxy structure 60A and second epitaxy structure 60B can each have an area no less than 1 mm$^2$. In some embodiments, first epitaxy structure 60A has an area no less than 0.34 mm$^2$, second epitaxy structure 60B has an area no less than 0.34 mm$^2$, or both first and second epitaxy structures 60A, 60B have an area no less than 0.34 mm$^2$.

Figure 25:
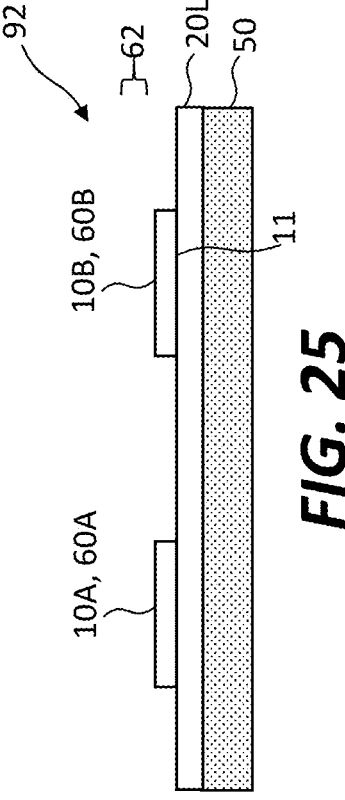
FIG. 25 is a cross section of an epitaxy structure adhered to a substrate with an adhesive layer according to illustrative embodiments of the present disclosure.

First or second epitaxy structures 60A, 60B, or both, can be disposed directly on and in direct contact with substrate 50 and directly adhered to substrate 50 with various bonds, such as van der Waals forces, hydrogen bonds, ionic bonds, covalent bonds, metallic bonds, or other chemical bonds. In some embodiments and as shown in FIG. 25, an adhesive 20L (e.g., an adhesive layer 20L) is disposed on substrate 50, for example by spray, spin, or slot coating. The adhesive layer 20L can coat a surface of substrate 50 or adhesive layer 20L can be a patterned layer of adhesive 20L. First or second epitaxy structures 60A, 60B, or both, can be disposed on adhesive 20L and adhered to substrate 50 with adhesive 20L, for example by micro-transfer printing first or second epitaxy structures 60A, 60B with stamp 40 from dicing tape 20. According to some embodiments of the present disclosure, because epitaxy structures 60 (e.g., components 10 therein) are cleaved from a component or epitaxy source wafer 12 (rather than etched), epitaxy structures 60 do not require a tether to be suitably micro-transfer printed and therefore, in some embodiments, do not have a broken (e.g., fractured) or separated tether.

Adhesive 20L can be a curable or cured adhesive (e.g., cured with heat or through exposure to radiation 38, such as UV, IR, or visible light radiation 38) and can be patterned using photolithographic methods including masked exposure and etching. Adhesive 20L optionally disposed between first epitaxy structure 60A and substrate 50 can have a first adhesive thickness and adhesive 20L between second epitaxy structure 60B and substrate 50 can have a second adhesive thickness. The first adhesive thickness and the second adhesive thickness can be substantially the same, for example within manufacturing process and material tolerances. First and second adhesives 20L can be disposed in a common step. First epitaxy structure 60A and second epitaxy structure 60B can be disposed with a horizontal surface (e.g., process sides or bottom sides 11) substantially parallel to a surface of substrate 50, for example a surface to which first and second epitaxy structures 60A, 60B are adhered, and can be substantially in a common plane. First epitaxy structure 60A can have substantially the same thickness as second epitaxy structure 60B (e.g., within manufacturing tolerances), or first epitaxy structure 60A and second epitaxy structure 60B can have different thicknesses.

Figure 26:
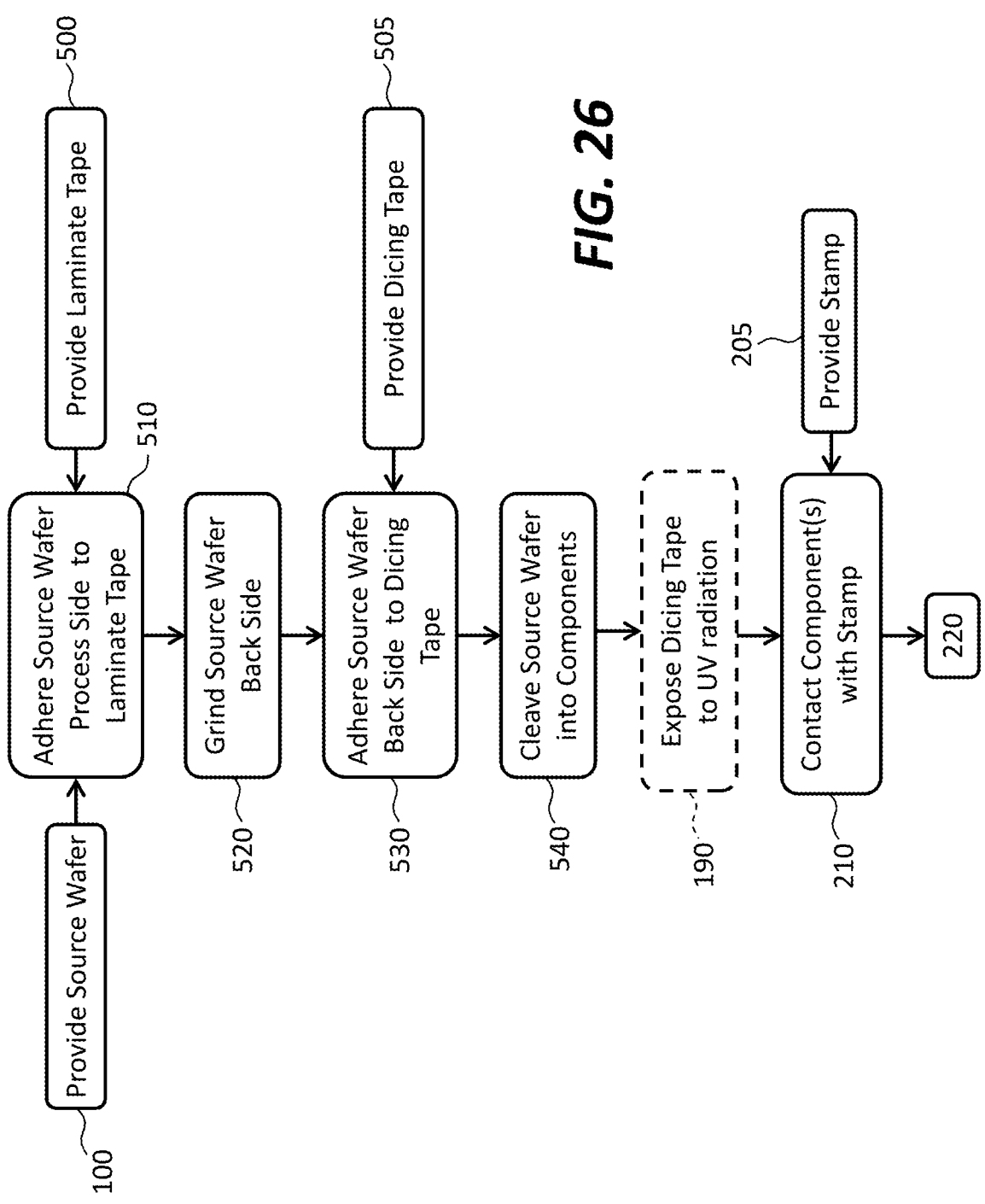
FIGS. 26 and 27 are flow diagrams according to illustrative embodiments of the present disclosure.

According to some embodiments of the present disclosure and as illustrated in FIG. 26, a method of making a multi-epitaxy structure 92 comprises providing an epitaxy source wafer 12 comprising one or more epitaxy structures 60 (e.g., components 10) in step 100, providing an adhesive surface (e.g., of a laminate tape) in step 500, providing an adhesive surface 20A (e.g., a surface of a dicing tape 20) in step 505, and providing a stamp 40 in step 205. A process side of epitaxy or component source wafer 12 is adhered to the adhesive surface of the laminate tape in step 510, exposing a back side of component source wafer 12. A grinder optionally grinds the back side of component source wafer 12 to a desired thickness, for example no greater than fifty, twenty, ten, five, or two microns in step 520. The back side of component source wafer 12 is adhered to dicing tape 20 in step 530 and components 10 of component source wafer 12 are cleaved around their perimeters 70 (e.g., diced with lasers, diamond saws, or by scribing and breaking) into one or more separated and individual epitaxy structures 60 or components 10 in step 540. Dicing tape 20 is optionally exposed to UV radiation 38 in step 190 to reduce the adhesion of dicing tape 20, if dicing tape 20 includes a UV-sensitive adhesive. Stamp 40 contacts and adheres one or more components 10 to a stamp post 42 in step 210 and the method continues with step 220 described above.

In some embodiments of the present disclosure, a laminate tape can be a handle or carrier wafer or substrate, and the process side of epitaxy or component source wafer 12 is adhered to the handle or carrier wafer, for example with an adhesive, exposing the back side of epitaxy or component source wafer 12, and enabling back grinding of the back side of component source wafer 12. The ground back side of component source wafer 12 is then adhered to adhesive surface 20A (e.g., an adhesive surface 20A of a dicing tape 20) and the handle or carrier wafer removed, e.g., by laser liftoff or disabling an adhesive adhering the process side of component source wafer 12 to the handle or carrier wafer and removing the handle or carrier wafer from component source wafer 12. The method can then continue by contacting stamp 40 to epitaxy structure 60 (e.g., component 10), providing a target substrate 50, contacting epitaxy structure 60 to target substrate 50 with stamp 40 to adhere epitaxy structure 60 to target substrate 50, and removing stamp 40 from target substrate 50 leaving epitaxy structure 60 adhered to target substrate 50. In some embodiments, dicing tape 20 or the laminate tape, or both, comprises a UV-sensitive adhesive having an adhesion, the ground back side of the source wafer is adhered to the UV-sensitive adhesive and methods comprise exposing the UV-sensitive adhesive to UV radiation 38 to reduce the adhesion of the UV-sensitive adhesive to epitaxy structure 60 before removing epitaxy structure 60 from dicing tape 20 with stamp 40.

Figure 27:
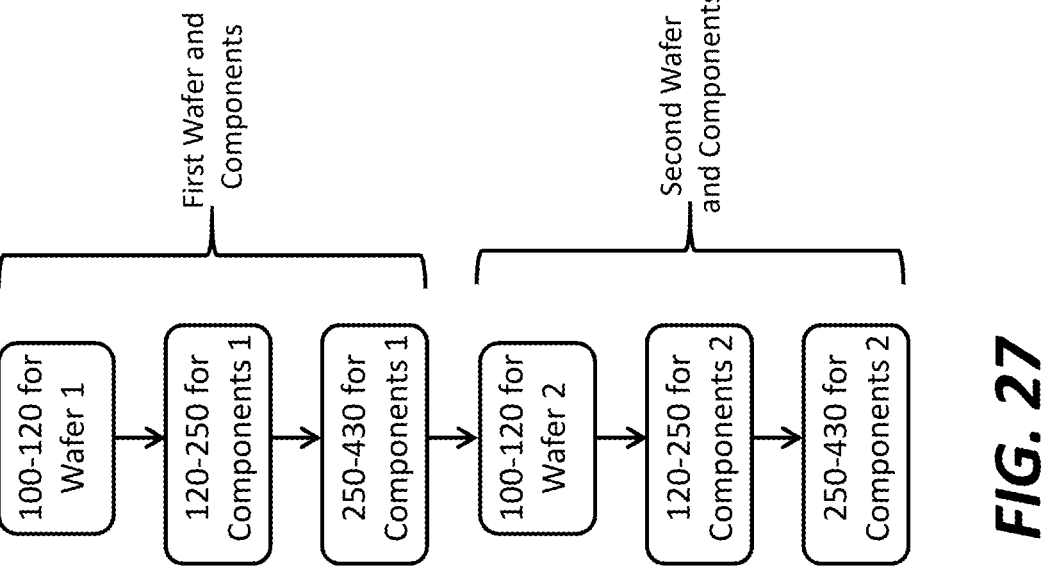

Methods of the present disclosure have been used to construct some of the embodiments described above, for example as illustrated in FIG. 27. As shown in FIG. 27, first components 10 from a first component source wafer 12 can be disposed on substrate 10 at a first time and then second components 10 from a second component source wafer 12 can be disposed on substrate 10 at a second time after the first time. First component source wafer 12 and first components 10 can comprise a first material different from a second material of second component source wafer 12 and second components 10. The process of FIG. 27 can be repeated for any number of different component source wafers 12 and components 10 comprising any desired material. In specific examples of multi-component structures 92 made according to methods of the present disclosure, a stamp post 42 of a stamp 40 contacted a process side of various components 10 comprising compound semiconductors on a dicing tape 20, adhered each component 10 to a stamp post 42, and removed components 10 and stamp 40 from dicing tape 20. Stamp 40 and component 10 were transferred to a target substrate 50 comprising silicon coated with a three-micron thick adhesive layer 20L, component 10 was adhered to target substrate 50 with adhesive layer 20L, and stamp 40 removed. Transferred components 10 ranged in thickness from 20 μm to 50 μm and had areas ranging from 555 μm by 620 μm to 4 mm by 4.6 mm. In some demonstrations, components 10 were each transferred individually with a stamp 40 and a single stamp post 42 from dicing tape 20 to a target substrate 50. In other demonstrations, multiple components 10 were transferred with a stamp 40 comprising multiple stamp posts 42 in a single transfer print step from dicing tape 20 to a target substrate 50.

According to some embodiments of the present disclosure, a multi-epitaxy structure 92 comprises a substrate 50, a first epitaxy structure 60A comprising a first crystalline material disposed on substrate 50, wherein the first epitaxy structure 60A has a cleaved perimeter and a first thickness no greater than fifty microns thick (e.g., no greater than forty microns thick, no greater than thirty microns thick, no greater than twenty microns thick, no greater than ten microns thick, or no greater than five microns thick), and a second epitaxy structure 60B comprising a second crystalline material different from the first crystalline material disposed on substrate 50, wherein the second epitaxy structure 60B has a cleaved perimeter and a second thickness no greater than fifty microns thick (e.g., no greater than forty microns thick, no greater than thirty microns thick, no greater than twenty microns thick, no greater than ten microns thick, or no greater than five microns thick). The first epitaxy structure 60A and the second epitaxy structure 60B can be disposed at least partly in a common layer over substrate 50 (e.g., have a top surface disposed in a common plane).

In some embodiments, a first or second epitaxy structure 60A, 60B is substantially planar. In some embodiments, a first or second epitaxy structure 60A, 60B has a length, a width, or both a length and a width that is no less than five, ten, twenty, fifty, or one hundred times the thickness of the corresponding first or second epitaxy structure. In some embodiments, a combined area of first and second epitaxy structures 60A, 60B is less than or equal to an area of a substrate 50. A first crystalline material can be a semiconductor, a second crystalline material can be a semiconductor, or both. A first crystalline material can be a doped or implanted semiconductor, or both. A second crystalline material can be a doped or implanted semiconductor, or both. A first crystalline material can be a compound semiconductor, a second crystalline material can be a compound semiconductor, or both.

According to some embodiments of the present disclosure, substrate 50 can be a semiconductor substrate. Substrate 50 can be a silicon substrate. In some embodiments, substrate circuit 66 is formed in or on and native to substrate 50. In some embodiments, first circuit 62A is native to (e.g., formed in or on) first epitaxy structure 60A, second circuit 62B is native to (e.g., formed in or on) second epitaxy structure 62B, or both. Substrate 50 can be a semiconductor substrate and can comprise a substrate circuit 66 native to the semiconductor substrate. Substrate 50 can comprise an amorphous material. A thin-film interconnect 68 can electrically connect substrate circuit 66 to first circuit 62A of first epitaxy structure 60A, a thin-film interconnect 68 can electrically connect substrate circuit 66 to second circuit 62B of second epitaxy structure 60B, or both. In some embodiments, a thin-film interconnect 68 electrically connects first circuit 62A to second circuit 62B on (e.g., over) substrate 50.

According to some embodiments of the present disclosure, a cleaved edge 70 of an epitaxy structure 60 is a cracked edge, a melted edge, a vaporized edge, a cut or scribed edge, or a sawn edge.

According to some embodiments of the present disclosure, first epitaxy structure 60A is disposed directly on substrate 50, second epitaxy structure 60B is disposed directly on substrate 50, or both. An adhesive 20L can be disposed on substrate 50 and first epitaxy structure 60A can be adhered to substrate 50 with the adhesive 20L, second epitaxy structure 60B can be adhered to substrate 50 with the adhesive, or both. The adhesive 20L between first epitaxy structure 60A and substrate 50 can have a first adhesive thickness and the adhesive 20L between second epitaxy structure 60B and substrate 50 can have a second adhesive thickness, and the first adhesive thickness and the second adhesive thickness can be substantially the same.

According to some embodiments of the present disclosure, first epitaxy structure 60A has a first surface, second epitaxy structure 60B has a second surface, and the first surface is substantially parallel to the second surface, the first surface is substantially in a common plane with the second surface, or both.

According to some embodiments of the present disclosure, first epitaxy structure 60A is a single crystalline structure, second epitaxy structure 60B is a single crystalline structure, or both, e.g., as designed and within manufacturing limitations.

According to some embodiments of the present disclosure, first epitaxy structure 60A has an area no less than 1 mm$^2$, second epitaxy structure 60B has an area no less than 1 mm$^2$, or both. According to some embodiments of the present disclosure, first epitaxy structure 60A has an area no less than 0.34 mm$^2$, second epitaxy structure 60B has an area no less than 0.34 mm$^2$, or both.

According to some embodiments of the present disclosure, first epitaxy structure 60A is hole-free, second epitaxy structure 60B is hole-free, or both.

According to some embodiments of the present disclosure, first epitaxy structure 60A has an aspect ratio of length to width of no greater than five, no greater than two, or no greater than 1.5, second epitaxy structure 60B has an aspect ratio of length to width of no greater than five, no greater than two, or no greater than 1.5, or both.

According to some embodiments of the present disclosure, a method of making a multi-epitaxy structure comprises providing a component source wafer comprising one or more components, providing an adhesive surface, and providing a stamp, adhering the component source wafer to the adhesive surface, optionally grinding the component source wafer to a desired thickness, cleaving the component source wafer into one or more separate components, adhering the stamp to one of the components, and removing the one component from the adhesive surface with the stamp. Methods according to the present disclosure can comprise grinding the source wafer to a desired thickness after adhering the source wafer to the adhesive surface. Methods according to the present disclosure can comprise providing a handle substrate, adhering the component source wafer to the handle substrate before adhering the component source wafer to the adhesive surface, adhering the component source wafer to the adhesive surface, and removing the handle substrate from the component source wafer. Methods according to the present disclosure can comprise grinding the component source wafer to a desired thickness after adhering the component source wafer to the handle substrate and before adhering the component source wafer to the adhesive surface. Methods according to the present disclosure can comprise providing a target substrate, contacting the one component to the target substrate with the stamp to adhere the one component to the target substrate, and removing the stamp from the target substrate leaving the one component adhered to the target substrate.

According to the present disclosure, a method of making a multi-epitaxy structure comprises providing a component source wafer having a process side opposite a back side, the component source wafer comprising one or more components formed in or on the process side, providing a laminate tape, providing a dicing tape, and providing a stamp, adhering the process side of the component source wafer to the laminate tape, grinding the back side of the component source wafer to a desired thickness, adhering the ground back side of the component source wafer to a dicing tape, cleaving the source wafer into one or more separate components, adhering the stamp to one of the components, and removing the one component from the dicing tape with the stamp. Methods according to the present disclosure can comprise providing a target substrate, contacting the one component to the target substrate with the stamp to adhere the one component to the target substrate, and removing the stamp from the target substrate leaving the one component adhered to the target substrate. The dicing tape can comprise a UV-sensitive adhesive having an adhesion and the ground back side of the source wafer is adhered to the UV-sensitive adhesive, and methods of the present disclosure can comprise exposing the UV-sensitive adhesive to UV radiation to reduce the adhesion of the UV-sensitive tape to the one component before removing the one component from the dicing tape with the stamp.

Embodiments of the present disclosure comprise providing a fiducial (alignment) mark 18 on each component 10 (as shown in FIG. 2A) to assist a micro-transfer printer in aligning a stamp post 42 with components 10 and a corresponding fiducial (alignment) mark 18 on adhesive surface 20A (or tape substrate 20S, as shown in FIG. 9A, or support substrate 32 as shown in FIGS. 7A-7B if present). Tape substrate 20S and adhesive surface 20A can be transparent to light used to facilitate alignment. Embodiments of the present disclosure can also comprise providing a fiducial (alignment) mark 18 on target substrate 50 as shown in FIGS. 7F-7I to assist a micro-transfer printer to align components 10 with target substrate 50.

Some embodiments of the present disclosure comprise a stamp 40 comprising a visco-clastic, elastomeric material that exhibits rate-dependent adhesion. In some embodiment, stamp 40 does not comprise a material that exhibits rate-dependent adhesion. For example, if a layer of adhesive is disposed on target substrate 50, components 10 can adhere to the adhesive layer with an adhesion stronger than that of component 10 to distal end of stamp post 42 without relying on rate-dependent adhesion. Similarly, adhesion between adhesive surface 20A and component 10 can be less than adhesion between component 10 and stamp post 42, particularly when delamination between component 10 and adhesive surface 20A proceeds over time, e.g., with a progressive delamination front 22, that spreads out the delamination over time and reduces the instantaneous adhesive force between component 10 and adhesive surface 20A so that a portion of adhesive surface 20A can be delaminated from a portion of component bottom side 11 with a reduced force compared to the force necessary to remove component 10 from adhesive surface 20A at a time, for example as discussed above with respect to FIGS. 8 and 10.

Embodiments of the present disclosure provide methods, structures, and materials that enable stamp-based printing for components 10 (e.g., small, thin, or fragile micro-devices) from an adhesive surface 20A (e.g., an adhesive layer or surface of a tape 20 such as a dicing tape 20). In particular, embodiments of the present disclosure can assemble (e.g., micro-assemble) components 10 that are much smaller, thinner, or more fragile or delicate than can be assembled using conventional assembly methods, such as pick-and-place or other vacuum-based transfer methods. Moreover, stamps 40 can comprise many stamp posts 42 that can pick up a corresponding number of components 10 in a single pick-and-print cycle. Commercial micro-transfer printers can print multiple devices in a single step and can perform multiple steps per minute so that many thousands (e.g., tens of thousands) of devices can be assembled per minute and hundreds of thousands or even many millions of components 10 can be assembled per hour with excellent precision (e.g., micron or sub-micron precision) according to some embodiments of the present disclosure. Such assembly rates exceed the available assembly rates of other commercial assembly equipment, such as pick-and-place equipment.

Component 10 can be an active circuit component 10, for example including one or more active electronic elements such as electronic transistors or diodes or light-emitting diodes or photodiodes that produce an electrical current in response to ambient light. Component 10 can be a passive component 10, for example including one or more passive elements such as resistors, capacitors, or conductors. In some embodiments, component 10 includes both active and passive elements. Component 10 can be a semiconductor device having one or more semiconductor layers, such as an integrated circuit. Component 10 can be an unpackaged die. In some embodiments, component 10 is a compound device having a plurality of active or passive elements, such as multiple semiconductor components 10 with separate substrates, each with one or more active elements or passive elements, or both. Component 10 can be or include, for example, an electronic processor, a controller, a driver, a light-emitting diode, a photodiode, a light-control device, a light-management device, a piezoelectric device, an acoustic wave device (e.g., an acoustic wave filter), an optoelectronic device, an electromechanical devices (e.g., a microelectromechanical device), a photovoltaic device, a sensor device, a photonic device, a magnetic device (e.g., a memory device), one or more elements thereof, or one or more combinations thereof.

It is contemplated that systems, devices, methods, and processes of the disclosure encompass variations and adaptations developed using information from the embodiments described herein. Adaptation and/or modification of the systems, devices, methods, and processes described herein may be performed by those of ordinary skill in the relevant art.

Throughout the description, where articles, devices, and systems are described as having, including, or comprising specific elements, or where processes and methods are described as having, including, or comprising specific steps, it is contemplated that, additionally, there are articles, devices, and systems according to certain embodiments of the present disclosure that consist essentially of, or consist of, the recited components, and that there are processes and methods according to certain embodiments of the present disclosure that consist essentially of, or consist of, the recited processing steps.

It should be understood that the order of steps or order for performing certain actions is immaterial so long as operability is not lost. Moreover, two or more steps or actions may be conducted simultaneously.

Certain embodiments of the present disclosure were described above. It is, however, expressly noted that the present disclosure is not limited to those embodiments, but rather the intention is that additions and modifications to what was expressly described in the present disclosure are also included within the scope of the disclosure. Moreover, it is to be understood that the features of the various embodiments described in the present disclosure were not mutually exclusive and can exist in various combinations and permutations, even if such combinations or permutations were not made express, without departing from the spirit and scope of the disclosure. Having described certain implementations of heterogeneous wafer structures, heterogeneous semiconductor structures, methods of their fabrication, and methods of their use, it will now become apparent to one of skill in the art that other implementations incorporating the concepts of the disclosure may be used.

Therefore, the disclosure should not be limited to certain implementations, but rather should be limited only by the spirit and scope of the following claims.

PARTS LIST

A cross section line
10 component
10A first component
10B second component
10C center component
11 component bottom side/epitaxy structure bottom side
12 component source wafer/epitaxy source wafer
14 scribe
16 pick-and-place tool
18 fiducial (alignment) mark
20 tape/dicing tape
20A adhesive surface
20L adhesive layer/adhesive
20S tape substrate
22 peel front/delamination front
30 tape frame
31 lattice opening
32 support substrate
34 gap
36 vacuum hole
38 radiation
39 patterned radiation
40 transfer device/stamp
42 stamp post/post
44 post frame
46 stamp bulk layer
48 post distance
49 frame distance
50 target substrate/substrate
60 epitaxy structure
60A first epitaxy structure
60B second epitaxy structure
62A first circuit
62B second circuit
64 common layer
66 substrate circuit
68 interconnect
70 cleaved perimeter/cleaved edge/cleaved edge face/cleaved side
90 micro-transfer-printing system
92 multi-epitaxy structure/multi-component structure
100 provide component source wafer with components step
110 attach dicing tape to wafer step
120 singulate component(s) and wafer step
130 contact component with pick-and-place tool step
140 remove component from adhesive tape step
150 contact components to target substrate step
160 remove pick-and-place tool step
190 optional expose dicing tape step
200 provide dicing tape with components on support step
205 provide stamp step
210 contact components with stamp step
220 press components against dicing tape with stamp step
230 pull components away from dicing tape with stamp to deform dicing tape step
240 delaminate dicing tape from component(s) step
250 remove component(s) from dicing tape with stamp step
300 suspend dicing tape with component(s) step
310 contact component(s) with stamp step 320 press component(s) with stamp to deform dicing tape step
330 pull component(s) with stamp to deform dicing tape step
340 delaminate dicing tape from component(s) step
350 remove component(s) from dicing tape with stamp step
400 move stamp with component(s) to target substrate step
410 contact component(s) to target substrate with stamp step
420 adhere component(s) to target substrate step
430 remove stamp from target substrate step
500 provide laminate tape step
505 provide dicing tape step
510 adhere component source wafer process side to laminate tape step
520 optional grind source wafer back side step
530 adhere source wafer back side to dicing tape step
540 cleave source wafer into component step

What is claimed is:

1. A method of assembling components, the method comprising:
   providing an elastomeric visco-elastic stamp;
   providing a component disposed on an adhesive surface of a tape substrate, wherein the tape substrate is disposed on and in contact with a planar support substrate that extends beyond the component;
   pressing the stamp against the component to adhere the component to the stamp with van der Waals forces;
   pulling the stamp away from the adhesive surface while the component is adhered to the stamp, wherein pulling the stamp away from the adhesive surface comprises separating the adhesive surface from the planar support substrate thereby creating a gap between the adhesive surface and the support substrate;
   removing the component from the adhesive surface with the stamp; and
   removing the component from the adhesive surface comprises releasing the adhesive surface such that the gap between the adhesive surface and the support substrate at least partially closes or is reduced.

2. The method of claim 1, wherein the component disposed on the adhesive surface is adhered to the adhesive surface with a chemical bond.

3. The method of claim 2, wherein the chemical bond is UV sensitive and the method comprises exposing the tape substrate to UV light after providing the component disposed on the adhesive surface.

4. The method of claim 1, comprising reducing adhesion between the component and the adhesive surface by applying energy to the adhesive surface.

5. The method of claim 1, wherein pulling the stamp away from the adhesive surface pulls the component away from the adhesive surface.

6. The method of claim 1, wherein pulling the stamp away from the adhesive surface comprises delaminating the adhesive surface from the component.

7. The method of claim 6, wherein the component comprises at least one corner and at least one edge and delaminating the adhesive surface from the component initially delaminates the adhesive surface from at least one of: the at least one corner and the at least one edge.

8. The method of claim 1, wherein an adhesion of a portion of the component to the adhesive surface is greater than an adhesion of the portion of the component to the stamp for a period of time while removing the component from the adhesive surface with the stamp.

9. The method of claim 1, comprises providing a plurality of components disposed on a suspended adhesive surface, the plurality of components comprising the component.

10. The method of claim 1, wherein the tape substrate is at least partly elastic.

11. A method of assembling components, the method comprising:

providing an elastomeric visco-elastic stamp;

providing a component disposed on an adhesive surface of a tape substrate, wherein the tape substrate is (i) disposed on and in contact with a planar support substrate that extends beyond the component or (ii) suspended by a tape frame disposed around the component;

pressing the stamp against the component to adhere the component to the stamp with van der Waals forces;

pulling the stamp away from the adhesive surface while the component is adhered to the stamp;

removing the component from the adhesive surface with the stamp;

providing multiple components disposed on the adhesive surface of the tape substrate, wherein the multiple components comprise the component;

pressing the stamp against each of the multiple components simultaneously to adhere the multiple components to the stamp;

pulling the stamp away from the adhesive surface while the multiple components are adhered to the stamp;

simultaneously removing each of the multiple components from the adhesive surface with the stamp; and prior to pressing the stamp against each of the multiple components, disposing an additional structure over the adhesive surface thereby segregating the multiple components into two or more groups, each of the two or more groups comprising one or more of the multiple components but less than all of the multiple components, wherein the additional structure holds the adhesive surface in place between the two or more groups.

12. The method of claim 11, wherein pulling the stamp away from the adhesive surface causes the adhesive surface to flex, bend, deform, elastically deform, or any combination of these, and removing the component from the adhesive surface with the stamp occurs while the adhesive surface is flexed, bent, deformed, or elastically deformed.

13. The method of claim 12, wherein the adhesive surface relaxes after the component is removed from the adhesive surface.

14. The method of claim 11, wherein the additional structure comprises (i) at least a portion of a tape frame or (ii) one or more post frames disposed on the stamp.

15. The method of claim 11, wherein the multiple components are disposed within a single lattice opening of a tape frame prior to the simultaneous removal of each of the multiple components from the adhesive surface.

16. The method of claim 11, wherein the additional structure surrounds a group of one or more components.

17. The method of claim 16, wherein the group of one or more components comprises only one component.

18. The method of claim 11, wherein the component disposed on the adhesive surface is adhered to the adhesive surface with a chemical bond.

19. The method of claim 18, wherein the chemical bond is UV sensitive and the method comprises exposing the tape substrate to UV light after providing the component disposed on the adhesive surface.

20. The method of claim 11, comprising reducing adhesion between the component and the adhesive surface by applying energy to the adhesive surface.

21. The method of claim 11, wherein pulling the stamp away from the adhesive surface pulls the component away from the adhesive surface.

22. The method of claim 11, wherein pulling the stamp away from the adhesive surface comprises delaminating the adhesive surface from the component.

23. The method of claim 22, wherein the component comprises at least one corner and at least one edge and delaminating the adhesive surface from the component initially delaminates the adhesive surface from at least one of: the at least one corner and the at least one edge.

24. The method of claim 11, wherein the adhesive surface relaxes after the component is removed from the adhesive surface.

25. The method of claim 11, wherein an adhesion of a portion of the component to the adhesive surface is greater than an adhesion of the portion of the component to the stamp for a period of time while removing the component from the adhesive surface with the stamp.

* * * * *